US011967937B2

United States Patent
Sun et al.

(10) Patent No.: US 11,967,937 B2
(45) Date of Patent: Apr. 23, 2024

(54) MODULARIZED POWER AMPLIFIER DEVICES AND ARCHITECTURES

(71) Applicant: VIASAT, INC., Carlsbad, CA (US)

(72) Inventors: Shih Peng Sun, Chandler, AZ (US); Kenneth V. Buer, Gilbert, AZ (US); Michael R. Lyons, Gilbert, AZ (US); Gary P. English, Chanlder, AZ (US); Qiang R. Chen, Phoenix, AZ (US); Ramanamurthy V. Darapu, Gilbert, AZ (US); Douglas J. Mathews, Mesa, AZ (US); Mark S. Berkheimer, Tempe, AZ (US); Brandon C. Drake, Mesa, AZ (US)

(73) Assignee: Viasat, Inc., Carlsbad, CA (US)

( * ) Notice: Subject to any disclaimer, the term of this patent is extended or adjusted under 35 U.S.C. 154(b) by 944 days.

(21) Appl. No.: 16/959,973

(22) PCT Filed: Jan. 17, 2019

(86) PCT No.: PCT/US2019/014070
§ 371 (c)(1),
(2) Date: Jul. 2, 2020

(87) PCT Pub. No.: WO2019/143854
PCT Pub. Date: Jul. 25, 2019

(65) Prior Publication Data
US 2020/0366259 A1     Nov. 19, 2020

Related U.S. Application Data

(60) Provisional application No. 62/618,956, filed on Jan. 18, 2018.

(51) Int. Cl.
*H03F 3/213*     (2006.01)
*H01L 21/48*     (2006.01)
(Continued)

(52) U.S. Cl.
CPC ......... *H03F 3/213* (2013.01); *H01L 21/4853* (2013.01); *H01L 23/49503* (2013.01);
(Continued)

(58) Field of Classification Search
CPC ...... H03F 3/213; H03F 1/56; H03F 2200/451; H03F 2200/222; H03F 2200/387;
(Continued)

(56) References Cited

U.S. PATENT DOCUMENTS

| 6,049,126 A | 4/2000 | Saitoh |
| 2002/0036542 A1 | 3/2002 | Buer et al. |

(Continued)

FOREIGN PATENT DOCUMENTS

| CN | 201887035 U | 6/2011 |
| CN | 103531558 A | 1/2014 |

(Continued)

OTHER PUBLICATIONS

International National Search Report and Written Opinion issued in co-pending International Application No. PCT/US2019/014070 dated May 3, 2019 in 15 pages.

*Primary Examiner* — Mohammad A Rahman
(74) *Attorney, Agent, or Firm* — Holland & Hart LLP

(57) ABSTRACT

A packaged semiconductor chip includes a semiconductor sub strate having formed thereon: radio-frequency (RF) input and output contact pads, DC contact pads, and first and second amplifier stages. An input of the first amplifier stage is coupled with the RF input contact pad. An input and an output of the second amplifier stage are respectively coupled to an output of the first amplifier stage and the RF output contact pad. The DC contact pads and the input of the first amplifier stages are connected via an input bias coupling path. The outputs of the amplifier stages are connected via an output bias coupling path. The chip further includes a lead (Continued)

frame having RF input and output pins electrically coupled to the RF input and output contact pads, and input bias pins electrically coupled to the DC contact pad.

23 Claims, 21 Drawing Sheets

(51) Int. Cl.
    *H01L 23/00* (2006.01)
    *H01L 23/495* (2006.01)
    *H01L 23/498* (2006.01)
    *H01L 23/66* (2006.01)
    *H03F 1/56* (2006.01)
    *H05K 1/18* (2006.01)

(52) U.S. Cl.
    CPC .... *H01L 23/4952* (2013.01); *H01L 23/49562* (2013.01); *H01L 23/49575* (2013.01); *H01L 23/49861* (2013.01); *H01L 23/66* (2013.01); *H01L 24/48* (2013.01); *H03F 1/56* (2013.01); *H05K 1/181* (2013.01); *H01L 2223/665* (2013.01); *H01L 2223/6655* (2013.01); *H01L 2224/48139* (2013.01); *H03F 2200/451* (2013.01)

(58) Field of Classification Search
    CPC . H03F 3/195; H03F 3/211; H03F 3/21; H03F 1/52; H01L 21/4853; H01L 23/49503; H01L 23/4952; H01L 23/49562; H01L 23/49575; H01L 23/49861; H01L 23/66; H01L 24/48; H01L 2223/665; H01L 2223/6655; H01L 2224/48139; H01L 2224/0603; H01L 2224/06138; H01L 24/06; H01L 24/49; H01L 2223/6683; H01L 2224/04042; H01L 2224/48091; H01L 2224/48227; H01L 2224/48265; H01L 2224/49111; H01L 2224/49112; H01L 2224/49171; H01L 2924/00014; H01L 2924/1033; H01L 2924/13091; H01L 2924/1423; H01L 2924/15165; H01L 2924/19105; H01L 2924/10323; H01L 2924/1306; H05K 1/181
See application file for complete search history.

(56) References Cited

U.S. PATENT DOCUMENTS

| | | | |
|---|---|---|---|
| 2004/0164407 A1* | 8/2004 | Nakajima | ............ H01L 23/5227 |
| | | | 257/E29.12 |
| 2007/0023897 A1 | 2/2007 | Nakajima et al. | |
| 2007/0176298 A1 | 8/2007 | Osone et al. | |
| 2008/0017998 A1 | 1/2008 | Pavio | |
| 2010/0246153 A1* | 9/2010 | Buer | ....................... H01L 23/66 |
| | | | 257/723 |
| 2011/0012680 A1 | 1/2011 | Kaido et al. | |
| 2011/0210795 A1 | 9/2011 | Ohta et al. | |
| 2015/0200660 A1 | 7/2015 | Masuda | |
| 2015/0235933 A1 | 8/2015 | Ladhani et al. | |
| 2016/0065153 A1* | 3/2016 | Park | ....................... H03F 3/3028 |
| | | | 330/293 |
| 2016/0285420 A1 | 9/2016 | Jones | |
| 2017/0085228 A1 | 3/2017 | Abdo et al. | |
| 2019/0050012 A1* | 2/2019 | Yang | ........................ G05F 1/575 |
| 2019/0207577 A1* | 7/2019 | Zhao | ........................ H03F 3/245 |

FOREIGN PATENT DOCUMENTS

| | | |
|---|---|---|
| JP | S63224508 A | 9/1983 |
| JP | 2004260364 A | 9/2004 |
| JP | 2005039320 A | 2/2005 |
| JP | 2014120582 A | 6/2014 |

\* cited by examiner

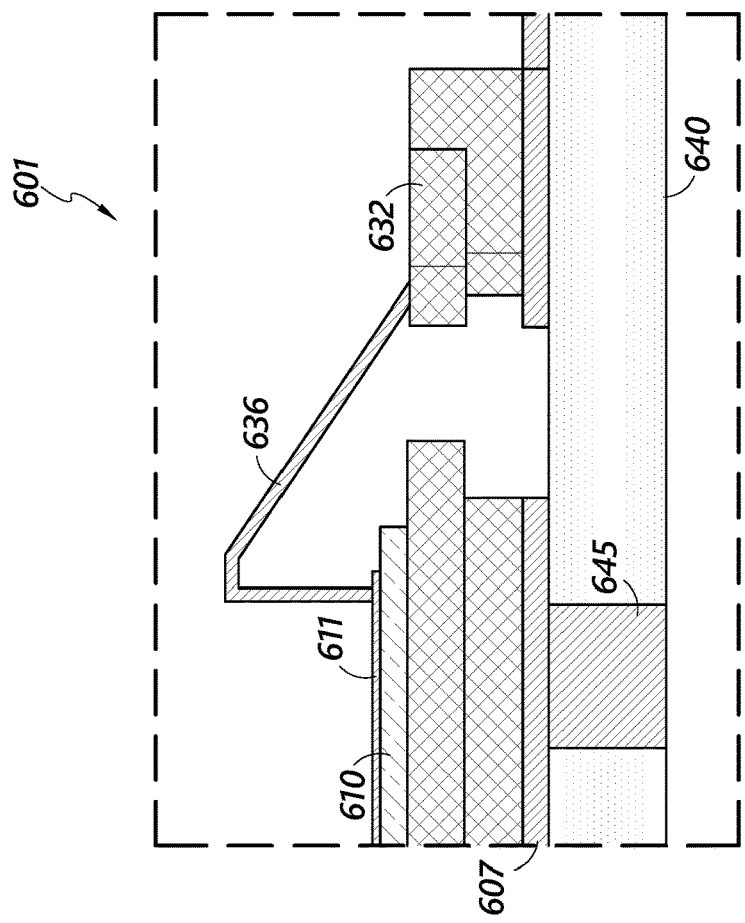
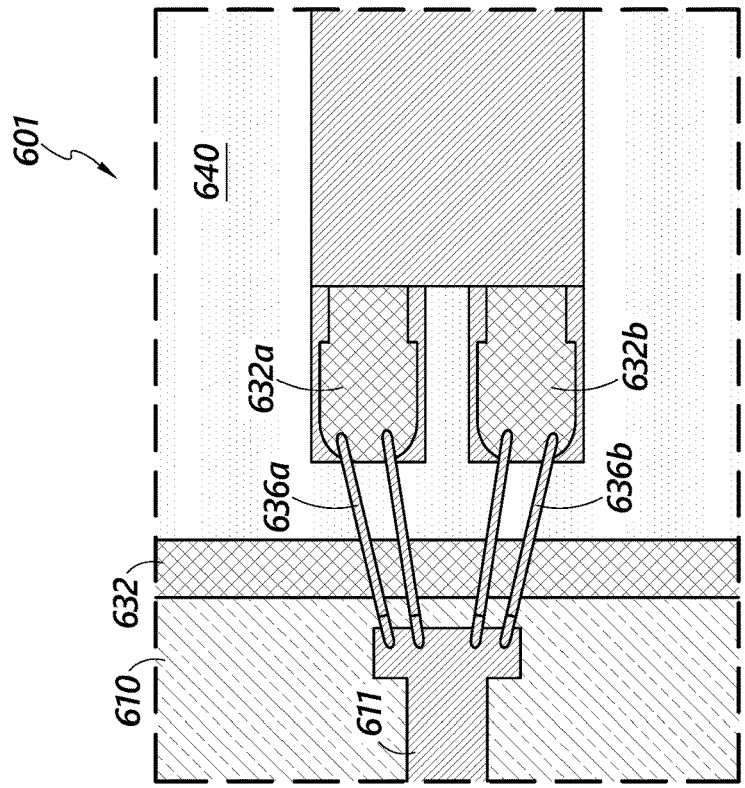
FIG. 6B
FIG. 6A

MODULARIZED POWER AMPLIFIER DEVICES AND ARCHITECTURES

CROSS-REFERENCE TO RELATED APPLICATIONS

This application is a U.S. National Stage entry of PCT Application No. PCT/US2019/014070, filed on Jan. 17, 2019, which claims priority from U.S. Provisional Application No. 62/618,956, filed Jan. 18, 2018, the contents of which are incorporated herein by reference in their entirety.

BACKGROUND

The present disclosure relates to radio-frequency power amplifier devices and architectures, and more particularly to high-power amplifiers. Certain power amplifiers, including high-power amplifiers, can be implemented at least in part using solid-state (e.g., semiconductor) substrates. Different semiconductor substrates provide different performance characteristics.

SUMMARY

Described herein are systems, devices, and methods for implementing modularized power amplifier architectures, including high-power amplifier architectures. In some implementations, the present disclosure relates to a packaged semiconductor chip comprising a semiconductor substrate, a radio-frequency input contact pad implemented on the semiconductor substrate, a radio-frequency output contact pad implemented on the semiconductor substrate, first and second direct-current (DC) contact pads implemented on the semiconductor substrate, an input bias coupling path implemented on the semiconductor substrate and electrically coupling the first DC contact pad to the second DC contact pad and the input contact pad, and one or more transistors implemented on the semiconductor substrate and having an input coupled to the input contact pad. The semiconductor substrate, input contact pad, output contact pad, first and second DC contact pads, input bias coupling path, and one or more transistors may be part of an internal amplifier/semiconductor die of the packaged semiconductor chip. The packaged semiconductor chip further comprises a lead frame comprising one or more radio-frequency input pins electrically coupled to the input contact pad, one or more radio-frequency output pins electrically coupled to the output contact pad, and first and second input bias pins electrically coupled to the first and second DC contact pads, respectively.

The one or more transistors may be configured to receive an output bias signal from at least one of the one or more radio-frequency output pins of the lead frame. In some embodiments, the first and second DC contact pads are disposed on opposite sides of the input contact pad. In some embodiments, the one or more transistors comprises a plurality of field-effect transistors and the input contact pad is electrically coupled to gates of the plurality of field-effect transistors. The input bias coupling path can allow for parallel daisy-chaining of the packaged semiconductor chip with another packaged semiconductor chip. The packaged semiconductor chip may further comprise DC-blocking circuitry implemented on the semiconductor substrate and configured to block DC current between the input contact pad and the inputs of the one or more transistors.

In some embodiments, the packaged semiconductor chip further comprises a first amplifier stage including the one or more transistors and a second amplifier stage having an input coupled to an output of the first amplifier stage. For example, the second amplifier stage can be DC blocked from the first amplifier stage. In some implementations, the packaged semiconductor chip further comprises an output bias coupling path electrically coupling an output of the second amplifier stage with the output of the first amplifier stage. In some embodiments, the second amplifier stage comprises a plurality of transistors connected in parallel and inputs of the plurality of transistors are electrically coupled.

The lead frame may be a component of a flat no-leads package. The packaged semiconductor chip can comprise an output matching circuit disposed within the package. For example, the output matching circuit can be implemented on the semiconductor substrate.

In some implementations, the present disclosure relates to a power amplifier comprising a printed circuit board and a plurality of packaged semiconductor chips mounted on the printed circuit board in a power amplifier configuration. Each of the plurality of packaged semiconductor chips comprises a semiconductor substrate, a radio-frequency input contact pad implemented on the semiconductor substrate, a radio-frequency output contact pad implemented on the semiconductor substrate, first and second direct-current (DC) contact pads implemented on the semiconductor substrate, an input bias coupling path implemented on the semiconductor substrate and electrically coupling the first DC contact pad to the second DC contact pad and the input contact pad, one or more transistors implemented on the semiconductor substrate and having an input coupled to the input contact pad, a lead frame comprising one or more radio-frequency input pins electrically coupled to the input contact pad, one or more radio-frequency output pins electrically coupled to the output contact pad, and first and second input bias pins electrically coupled to the first and second DC contact pads, respectively, and a surface-mount packaging that at least partially houses the semiconductor substrate and the lead frame.

In some embodiments, the plurality of packaged semiconductor chips are identical. The plurality of packaged semiconductor chips may comprise a first set of parallel packaged semiconductor chips and a second set of parallel packaged semiconductor chips, wherein each of the first set of parallel packaged semiconductor chips is connected in series with at least one of the second set of parallel packaged semiconductor chips. In some embodiments, the power amplifier further comprises matching circuitry implemented on the printed circuit board that is configured to combine with parasitic elements of the plurality of packaged semiconductor chips to provide impedance matching for the plurality of packaged semiconductor chips for high-frequency operation. For example, the high-frequency operation may correspond to the Ka frequency band.

In some implementations, the present disclosure relates to a method of manufacturing a power amplifier. The method comprises providing a plurality of packaged semiconductor chips each including respective internal bias coupling paths electrically coupling a first direct-current (DC) contact pad, a second DC contact pad, and an input terminal of respective packaged semiconductor chips. The method further comprises providing a first circuit board, forming first electrical connections in the first circuit board for connecting to a first subset of the plurality of packaged semiconductor chips, and surface mounting the first subset of the plurality of packaged semiconductor chips on the first circuit board in a first multi-stage power amplifier configuration. The first electrical connections comprise parallel daisy-chain connections between at least two of the first subset of the plurality of packaged semiconductor chips.

The method may further comprise, after said surface mounting the first subset of the plurality of packaged semiconductor chips, providing a second circuit board, forming second electrical connections in the second circuit board for connecting to a second subset of the plurality of packaged semiconductor chips, and surface mounting the second subset of the plurality of packaged semiconductor chips on the second circuit board in a second multi-stage power amplifier configuration, the second multi-stage power amplifier configuration having a greater number of amplifier stages than the first multi-stage power amplifier configuration, wherein the second electrical connections comprise parallel daisy-chain connections between at least two of the second subset of the plurality of packaged semiconductor chips.

The method may further comprise determining biasing values for the first subset of the plurality of packaged semiconductor chips based on parasitic elements of the first subset of the plurality of packaged semiconductor chips at a high operational frequency. In some embodiments, the method further comprises determining a number of packaged semiconductor chips of the plurality of packaged semiconductor chips to connect in parallel after said providing the plurality of packaged semiconductor chips. In some embodiments, the method further comprises determining a number of packaged semiconductor chips of the plurality of packaged semiconductor chips to connect in series after said providing the plurality of packaged semiconductor chips.

For purposes of summarizing the disclosure, certain aspects, advantages and novel features have been described herein. It is to be understood that not necessarily all such advantages may be achieved in accordance with any particular embodiment. Thus, the disclosed embodiments may be carried out in a manner that achieves or optimizes one advantage or group of advantages as taught herein without necessarily achieving other advantages as may be taught or suggested herein.

BRIEF DESCRIPTION OF THE DRAWINGS

Various embodiments are depicted in the accompanying drawings for illustrative purposes and should in no way be interpreted as limiting the scope of this disclosure. In addition, various features of different disclosed embodiments can be combined to form additional embodiments, which are part of this disclosure.

FIGS. 6A and 6B illustrate top and side views, respectively, of an interface between a semiconductor die and a lead frame associated with a chip packaging in accordance with one or more embodiments.

DETAILED DESCRIPTION

Figure 1:
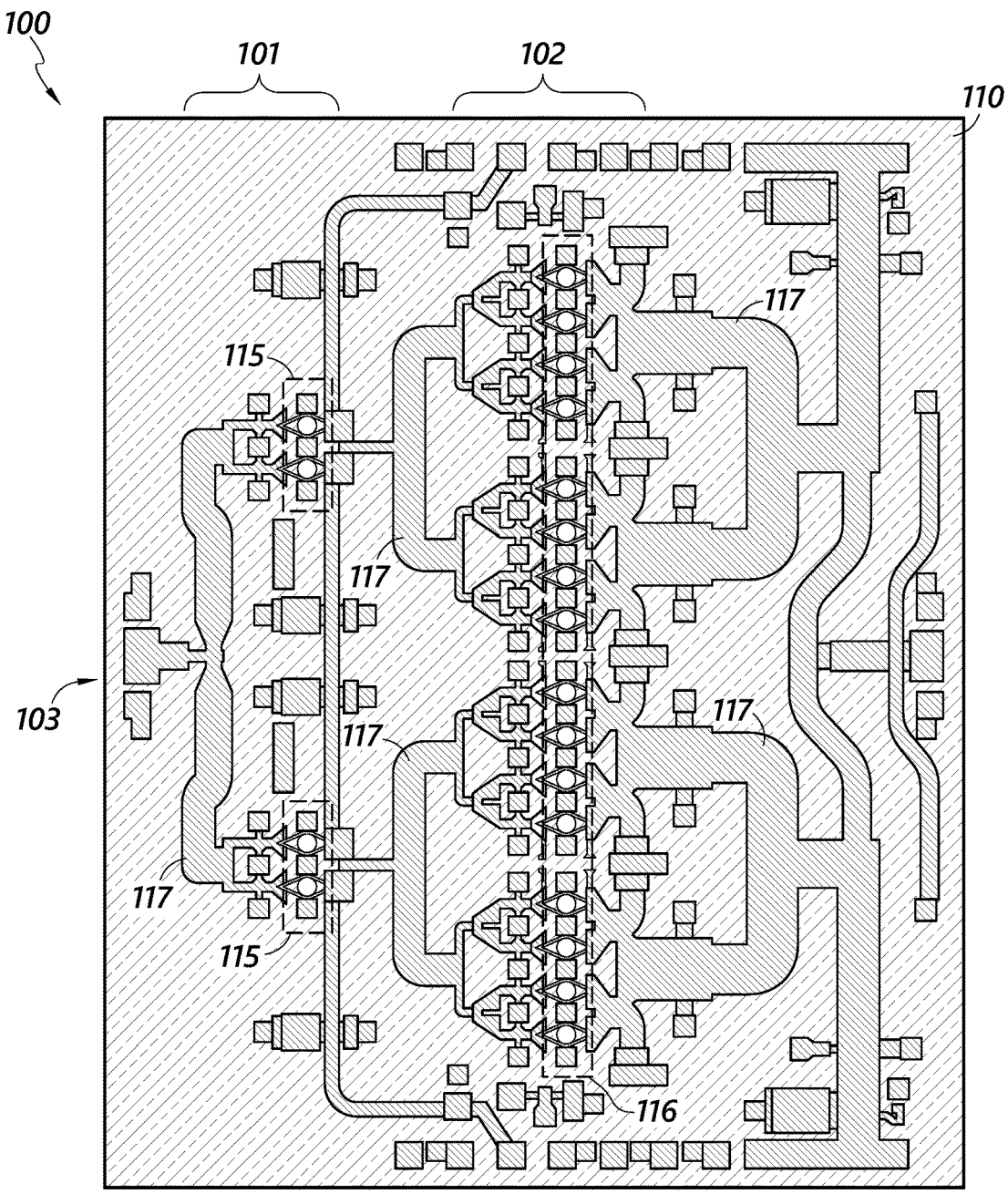
FIG. 1 is a plan view of an active power amplifier device in accordance with one or more embodiments.

The headings provided herein are for convenience only and do not necessarily affect the scope or meaning of the claimed invention.

In certain implementations, the present disclosure relates to systems, devices and methods for implementing modularized power amplifier architectures, including high-power amplifier architectures. Power amplifier modularization in accordance with the present disclosure may involve combining relatively small gallium nitride (GaN) die in quad flat no-leads (QFN) packages on a relatively inexpensive substrate (e.g., printed circuit board (PCB)) as an alternative to implementing a power amplifier architecture wholly on a single relatively large GaN die.

The need for high-power amplifiers configured to operate at microwave frequencies has led to the development of transistor amplifiers implemented on semiconductor substrates that can supply relatively high-power signals at radio frequencies (e.g., microwave frequencies, including $K_a$ band). In the context of the present disclosure, the term "high power" is used to refer to power levels greater than approximately 10 W (or 40 dBm) output power. The term "high frequency" is used herein to refer to frequencies greater than approximately 10 gigahertz (GHz). Such devices may comprise substrates composed of gallium arsenide (GaAs) or the relatively more expensive semiconductor, gallium nitride (GaN).

GaAs and GaN are category III-V compound semiconductors. GaAs and GaN are suitable for radio-frequency (e.g., microwave) applications due to their relatively high electron mobility characteristics compared to silicon. Embodiments of power amplifiers and other circuitry disclosed herein may comprise transistor devices of any suitable or desirable type, including but not limited to bipolar junction transistors (BJTs), field-effect transistors (FETs), and other types of transistors and solid-state devices. For example, FETs in accordance with embodiments of the present disclosure may comprise enhancement-mode metal-oxide-semiconductor field-effect transistors (MOSFETs), metal-semiconductor FETs (MESFETs), or any other type of FET. Additional types of transistors that may be implemented in accordance with aspects of the present disclosure include heterojunction bipolar transistors (HBTs), high electron mobility transistors (HEMTs), laterally diffused MOS (LDMOS), and other suitable or desirable transistors.

GaAs power amplifiers are generally not suitable for high-power applications. For example, the upper limit of GaAs devices may generally be considered to be up to about 5 W due to their inability to withstand the high voltages, currents, and heat levels of certain other semiconductor technologies, such as GaN. Of course, higher-power operation may be achievable by combining a sufficient number of GaAs devices in push-pull or parallel or combinations. However, where simpler and/or smaller designs are desired, other technologies, such as GaN, may be preferable.

More recent developments in power amplifier technology have led to increased use of GaN die as high-power, high-frequency (e.g., microwave) amplifier substrates. For example, GaN power amplifiers are suitable for certain microwave and millimeter-wave electronics, including satellite communications, radar, and other high-frequency applications. Generally, relative to GaAs and certain other technologies, the relatively high power density and/or ability to dissipate heat from a relatively small package of certain GaN devices can make it a suitable or desirable choice for high-power applications. For example, while GaAs has a basic power density of less than 1.5 W/mm, GaN has a power density ranging from about 3-7 W/mm. Furthermore, as referenced above, GaN has a relatively high electron mobility, allowing it to amplify signals well into the upper-gigahertz ranges (e.g., up to 200 GHz, or higher), and generally can operate in such ranges at relatively high breakdown voltages levels (e.g., up to 80 V, or higher). Individual GaN amplifiers can achieve power levels of tens of watts. Furthermore, in certain parallel, push-pull, and/or Doherty configurations, power levels of hundreds to thousands of watts are possible. For all of the reasons outlined above, GaN amplifiers may be preferable to travelling wave tube (TWT) amplifiers in certain satellite applications, particularly in relatively lower-power satellite applications.

Certain embodiments disclosed herein relate to high-power amplifier architectures configured to operate in the Ka band, which corresponds to a portion of the microwave range of the electromagnetic spectrum between 26.5-40 gigahertz (GHz), corresponding to wavelengths from slightly over one centimeter down to about 7.5 millimeters. The Ka band (e.g., the 30/20 GHz band) is a suitable frequency band for satellite uplinks and/or other satellite applications. In satellite communications, the Ka band allows for higher bandwidth communication. The Ka band is more susceptible, however, to rain attenuation than some lower-frequency bands.

Due to the various characteristics of gallium nitride (GaN) outlined above, single-die power amplifier architectures can be implemented for high-power applications using GaN die. FIG. 1 is a plan view of an active power amplifier device 100 implemented on a GaN die 110. The power amplifier 100 of FIG. 1 may be a high-power, high-frequency power amplifier. Furthermore, the amplifier 100 may be a multi-stage power amplifier, as illustrated.

FIG. 1 illustrates the power amplifier 100 as a two-stage power amplifier comprising a first stage 101 coupled to a second-stage 102 in series. The first stage 101 of the amplifier 100 is illustrated as including four amplifier transistors 115 coupled in parallel and the second stage 102 includes sixteen amplifier transistors (identified collectively as 116) connected in parallel. Such an amplifier architecture/configuration may be suitable for high-frequency operation, such as Ka-band operation. Connectivity between the active devices and the various terminals of the device 100 is achieved using a layout of conductive traces 117. The trace network may serve to provide power-combining functionality, as well as impedance-matching characteristics. The impedance of the respective conductive traces may be determined at least in part by the width thereof.

With respect to the GaN amplifier device 100 of FIG. 1, the active GaN devices 115, 116 may occupy as little as 10% or less of the overall area of the die 110 in some embodiments. The remainder of the area of the die 110 may be occupied at least in part by certain passive circuitry including one or more resisters, inductors, capacitors, combiners, bias feeds, radio-frequency chokes, and/or the like. The passive circuitry can include power-combining connections and impedance matching features to match impedances from the active devices. That is, the passive circuitry/connections can advantageously provide matching impedance to provide a 50-ohm impedance at the interfaces of the amplifier 100 to allow the active devices to operate efficiently. For example, at the input side 103 of the amplifier, the passive circuitry/connections may serve to split the input signal, as shown, and further to provide matching impedance to the input of the active devices 115.

One aspect of GaN that may be considered a downside is its relatively high material and processing costs compared to certain other semiconductor technologies, such as bulk CMOS or GaAs. Furthermore, single-chip GaN high-power amplifiers, like that shown in FIG. 1, can presents difficulties with respect to thermal issues. For example, GaN high-power amplifiers can generate a substantial amount of heat; when the entire power amplifier architecture is formed on a single GaN die, it may be necessary to remove a substantial amount of heat from a relatively small space/structure. Furthermore, while it can be advantageous for the active devices 115, 116 of the amplifier 100 to be implemented on GaN or other relatively expensive substrate in order to provide desirable performance at higher frequencies, the passive circuitry of the amplifier 100 may not receive the same degree of benefit from implementation on higher-cost substrate. That is, in some implementations, it may be suitable for passive circuitry to be implemented on relatively inexpensive die (e.g., GaAs or printed circuit board (PCB)), even for high-frequency applications.

In some implementations, embodiments of the present disclosure provide an alternative to the relatively-expensive and difficult-to-cool single-die amplifier solution represented in FIG. 1 by realizing a high-power GaN (or other substrate) amplifier in a modularized power amplifier architecture made up of relatively smaller portions of surface mount devices or packages containing relatively smaller GaN (or other substrate) die. Such smaller discrete packages can be combined and mounted on relatively inexpensive media, such as PCB or silicon, such that the packaged semiconductor chips serve as building blocks of a larger power amplifier system/architecture. Such embodiments may allow for formation of a high-power amplifier system configured to achieve the gain and power level desired with drastic cost reduction. With this approach, in some embodiments, 50% or more reduction in GaN (or other substrate) chip area can be achieved without sacrificing output power level. Modularized high-power amplifier architectures in accordance with the present disclosure can leverage the advantages of GaN with respect to high power capability, but avoid the costs typically associated with a larger GaN chip/die. The following disclosure describes certain semiconductor substrate elements as GaN substrates for convenience and simplicity. However, any reference herein to GaN should be understood to be applicable to any other type of semiconductor substrate having relatively high power density, electron mobility, and/or heat dissipation characteristics compared to GaAs, including by not limited to indium phosphide (InP), Indium Gallium Arsenide ($In_xGa_yAs$), silicon carbide (SiC), industrial-grade diamond, glass, graphene, and the like, whether known or developed in the future.

Breaking-up the single-chip high-power amplifier solution of FIG. 1 into a modularized high-power amplifier system using several smaller packaged semiconductor chips can also provide thermal advantages. For example, in the single-chip embodiment of a GaN high-power amplifier, in some solutions, a substantial amount of heat can be generated within the chip. Furthermore, heat transfer may typically only occur on the backside of the die. By using relatively small, discrete packaged semiconductor chips, the total amount of heat generated can be spread out over a wider area. In addition, heat transfer mechanisms can be applied on both the top and bottom of the package when certain surface-mount packages (e.g., QFN) are used to further help to remove heat. These thermal benefits can translate into higher performance and/or longer expected product lifetime.

In addition to the cost and thermal-based benefits addressed above, additional benefits may be achieved using modularized power amplifier architectures as disclosed herein. For example, in lab testing environments, reworking of amplifier devices can be done on the surface-mount packaged semiconductor chips in the high-power amplifier system, such as by changing-out defective chips or part. Also, re-designing may simply involve a re-design of the board that combines the packaged semiconductor chips, which may generally involve shorter re-design cycle and/or lower manufacturing cost compared to re-design of a single large GaN chip.

Packaged semiconductor chips for use as building-blocks in a modularized power amplifier system in accordance with embodiments of the present disclosure may comprise a surface-mount packaging, such as a no-leads package, which may contain a single relatively-small GaN die. One example of a package type that may be used in connection with embodiments of the present disclosure is a quad flat no-leads package (QFN), as referenced above, which is a surface-mount package that connects circuit die to a printed circuit board (PCB) or other substrate without the need for through-holes. QFN packages are generally plastic-encapsulated and comprise a substantially planar conductive (e.g., copper) lead frame. In some embodiments, perimeter pins on the bottom of the package provide electrical connections to the PCB. In some embodiments, QFN packages include an exposed thermal pad, or paddle, on an underside thereof to improve heat transfer out of the chip and into the PCB. Heat transfer can be further facilitated by metal vias in the thermal pad/paddle. Packaged semiconductor chips in accordance with embodiments of the present disclosure may include backside-patterned dies having signal vias, flip-chip dies, flip-chip implemented in QFN, wire-bonded die in QFN, wafer-level fan-out packages, and/or other packaging. Although certain embodiments are disclosed herein in the context of QFN packages, it should be understood that the principles disclosed herein are applicable to any other type of package.

As referenced above, the cost associated with high-cost substrate processes (e.g., GaN) can be exacerbated by utilizing significant portions of the area of such die for passive circuitry (e.g., matching circuitry) not benefiting sufficiently from the characteristics of the high-cost substrate. For example, certain implementations of GaN high-power amplifiers utilize the majority of the die area for passive circuits used for impedance matching, power splitting, and/or combining. Embodiments disclosed herein provide more cost-effective power amplifiers and other devices by utilizing a relatively higher percentage of high-cost die area for active devices, such as amplifier transistors (e.g., FETs). By breaking up an otherwise larger amplifier chip into modularized smaller chips and implementing at least a portion of the associated power splitting, combining, and/or impedance matching circuitry on relatively cheaper media, costs associated with power amplifier production can be reduced significantly.

Figure 2:
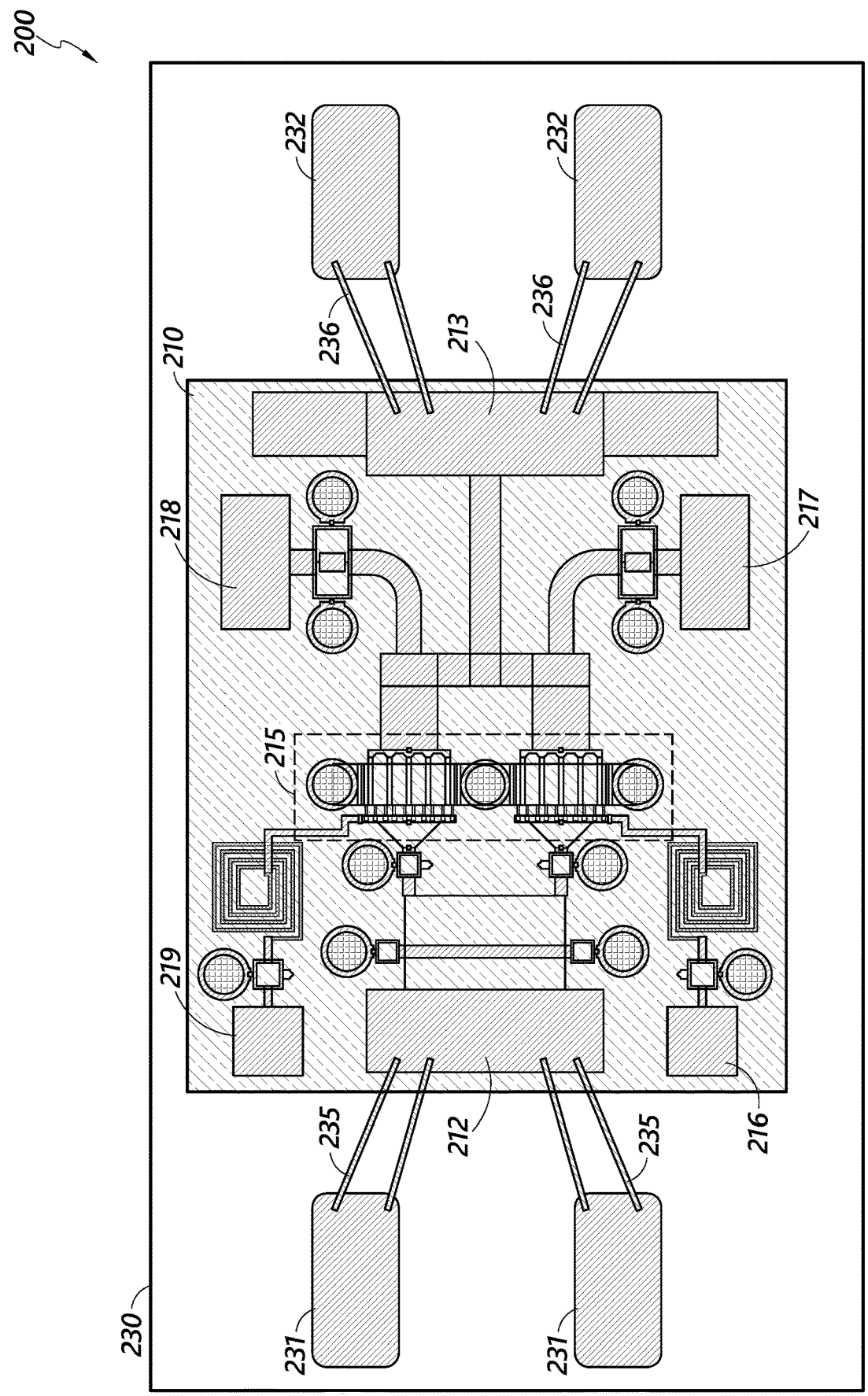
FIG. 2 illustrates a packaged semiconductor chip for use in a modularized high-power amplifier architecture in accordance with one or more embodiments.

FIG. 2 illustrates a packaged semiconductor chip 200 for use in a modularized high-power amplifier architecture including a semiconductor substrate (e.g., gallium nitride (GaN)) semiconductor substrate 210 in accordance with one or more embodiments of the present disclosure. For illustration purposes, the packaged chip 200 is described below as a QFN chip. As referenced above, a surface-mount package can comprise a lead frame secured to an over-mold housing 230. In some embodiments, the lead frame is approximately 8 to 10 mm thick and comprises copper or other metal. The lead frame may be etched or stamped to form a plurality of pins and/or ground-reference pads/layers. Although FIG. 2 shows a wire-bonded QFN package as an example, it should be understood that principles disclosed herein are applicable to other types of relatively small surface-mount devices and packages.

In some embodiments, the chip 200 comprises one or more input pins 231 that are wire-bonded to an input pad 212 of the semiconductor substrate 210. The packaged chip 200 of the illustrated embodiment of FIG. 2 comprises a single amplifier stage. Although a single amplifier stage is shown implemented on the semiconductor substrate 210, it should be understood that the packaged chip 200 may comprise a two amplifier stages in some embodiments.

The semiconductor substrate 210 may advantageously be utilized primarily for active amplifier devices, such as FETs, BJTs, or other active device(s). Additionally, the semiconductor substrate 210 may have implanted thereon certain passive circuitry designed to provide an efficient interface for the semiconductor substrate 210. For example, the semiconductor substrate 210 may comprise certain passive circuitry configured to provide partial matching on the semiconductor substrate 210. In some embodiments, the semiconductor substrate 210 includes partial impedance matching to provide an impedance that is realizable to enable the wirebonds and packaging to tolerate the parasitic elements of the package. That is, the parasitic elements associated with the package of the chip 200 may be incorporated into an impedance-matching design for the chip 200. In some embodiments, the semiconductor substrate 210 comprises a plurality of direct-current (DC) contact pads 216-219, which may be used for injecting input and/or output biasing signals.

The semiconductor substrate 210 may be relatively small compared to certain other implementations of GaN high-power amplifiers, as explained above. With respect to relatively small die, such as that shown in FIG. 2, it may be desirable to take into account substrate losses when singulating the GaN chip from a GaN wafer in accordance with chip-manufacturing processes. For example, approximately 100 µm may be lost and cut away around the periphery of the semiconductor substrate 210 as part of the sawing/die-singulation process when manufacturing the semiconductor substrate 210. Therefore, the smaller the area of the semiconductor substrate 210, the greater the percentage of the area associated therewith that is wasted as a result of sawing/singulation. Therefore, in order to achieve a more efficient use of semiconductor substrate (e.g., GaN) area, it may be desirable to include a two-stage, or other multi-stage, amplifier design on the semiconductor substrate 210.

With only the single semiconductor substrate 210 housed within the package 230, the packaged chip 200 may present a relatively robust interface by not requiring any chip-to-chip interfaces. By not requiring GaN substrate to be used for certain passive circuitry, the chip 200 may advantageously provide GaN area savings of up to 30% or more relative to the high-power amplifier design of FIG. 1. By using a no-leads surface-mount package, it may be possible to use surface-mount technology reflow assembly rather than chip and bondwire assembly, which may be relatively cheaper to implement.

Figure 3:
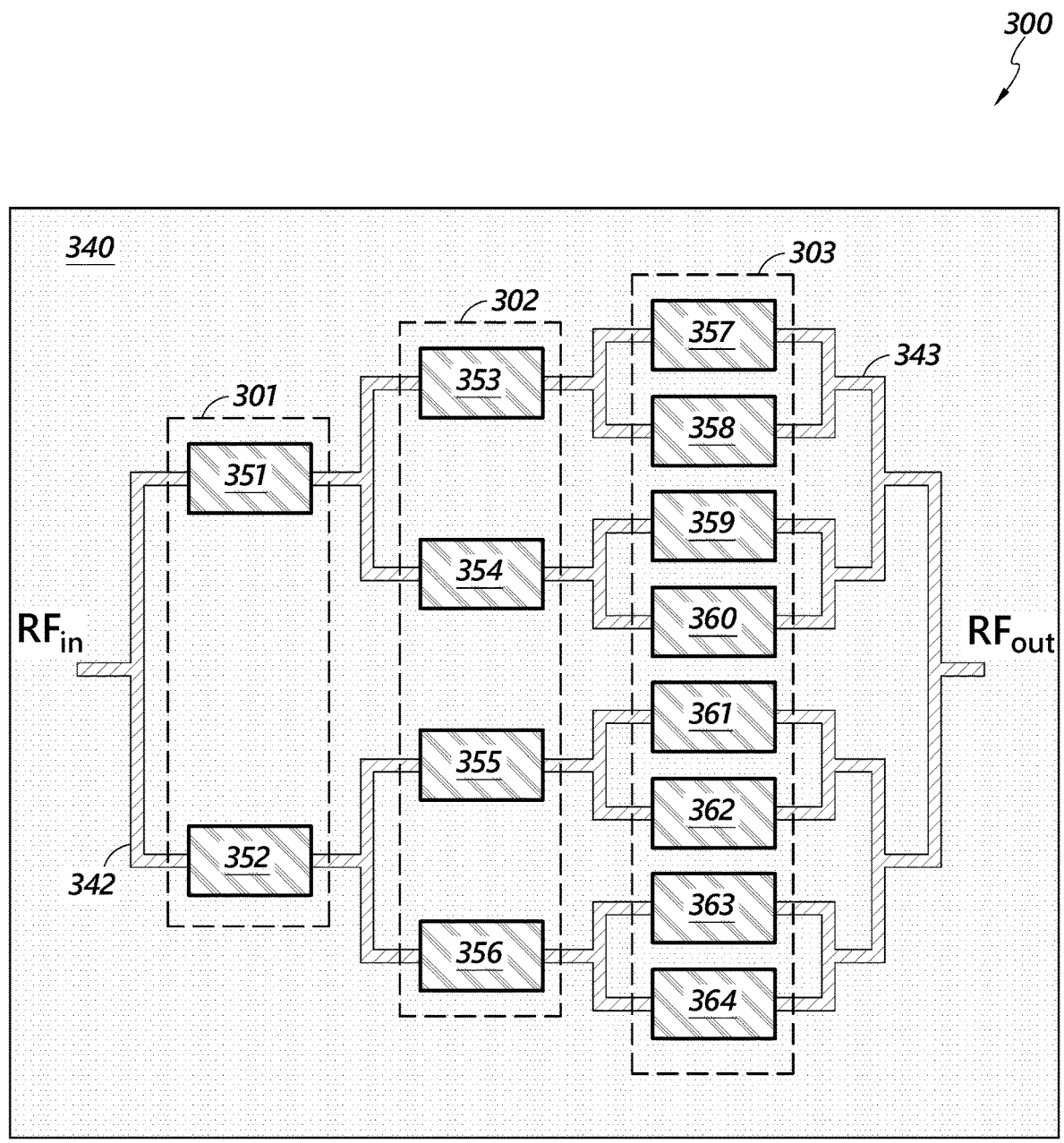
FIG. 3 illustrates an example power amplifier architecture utilizing discrete packaged semiconductor chips in accordance with one or more embodiments of the present disclosure.

Individual packaged semiconductor chips similar to that illustrated in FIG. 2 and described above may be utilized as building-blocks in a larger modularized power amplifier architecture. Modularized power amplifier architectures may be constructed by combining a plurality of discrete amplifier chips in a desired arrangement/configuration on a printed circuit board. That is, a plurality of identical, or substantially identical, packaged semiconductor chips may be used as building-blocks for constructing a power amplifier, wherein each individual chip comprises a discrete amplifier unit of the larger power amplifier architecture. The term "identical," as used herein with respect to packaged semiconductor chips and/or component(s) thereof, is intended to account for manufacturing tolerances and variation across different devices, components, and/or systems manufactured according to a common plan, configuration, architecture, design, and/or form. Therefore, "identical" chips/components described herein may have certain differences that can be attributed to manufacturing tolerances or expected variance. FIG. 3 illustrates an example power amplifier architecture 300 utilizing discrete packaged semiconductor chips 351-364 as modularized individual amplifier components thereof, which may be separately mounted on a printed circuit board (PCB) 340 in accordance with one or more embodiments of the present disclosure.

By implementing a modularized power amplifier like that shown in FIG. 3, certain cost, flexibility, and/or performance benefits may be achieved. For example, in some implementations, a power amplifier architecture may be implemented utilizing passive circuitry implemented at least in part on relatively lower-cost materials, such as on the PCB 340, whereas active amplifying devices, such as transistors, may be implemented on relatively higher-cost materials, such as GaN die within individual amplifier chips (e.g., 351-364).

By implementing active amplifier transistors in modularized amplifier chips, higher yields of such chips comprising relatively higher-cost materials may be achievable. Furthermore, by building larger power amplifier architectures using amplifier chip building-blocks, greater flexibility in power amplifier design is possible, wherein changes to power amplifier architecture may be implemented by changing PCB layouts, such that additional semiconductor fabrication cycles are not required.

In some embodiments, the individual packaged semiconductor chips 351-364 may comprise QFN packages, as described in detail herein. The packaged semiconductor chips 351-364 may be mounted to the PCB 340. It should be understood that the PCB 340, packaged chips 351-364, and/or connections associated therewith are not necessarily drawn to scale in the diagram of FIG. 3, nor are elements of the other figures described herein necessarily drawn to scale.

The power amplifier 300 may represent an alternative implementation of a high-power amplifier compared to the high-power amplifier 100 illustrated in FIG. 1. With individual packaged semiconductor chips spread out on the PCB 340, as shown, the thermal profile of the power amplifier 300 may be relatively spread-out on the board 340, thereby providing heat-dissipation benefits for the power amplifier 300 relative to single-chip power amplifier architectures. For example, the architecture 300 may suffer from less thermal leakage and may have higher isolation relative to single-chip power amplifier solutions. Where additional thermal benefits are desired, relatively larger board sizes may be implemented to further spread out the individual modularized packaged semiconductor chips. However, a trade-off for the thermal separation of the architecture 300 may be that the power amplifier 300 would have a relatively larger footprint than a comparable single-chip power amplifier solution. In addition to the thermal isolation provided by the spacing of individual packaged chips, where such chip packaging is QFN packaging, the GaN substrate may sit on a metal paddle that is connected to the chassis/housing of the package, which may further aid in heat dissipation.

The power amplifier 300 illustrated in FIG. 3 is a three-stage power amplifier. However, it should be understood that the principles disclosed herein are applicable to any type of power amplifier architecture having any number of stages. Compared to three-stage single-chip power amplifier architectures, the power amplifier 300 may be configured to provide equivalent performance, while utilizing a smaller total area of GaN substrate. Therefore, the power amplifier 300 may be manufacturable at a lesser cost compared to certain single-chip power amplifiers. Furthermore, as each of the individual packaged chips 351-364 may be relatively less complex than a single-chip amplifier (e.g., including fewer active devices and/or other components), a higher yield may be achievable due at least in part to a rolled-yield effect. For example, a given modularized packaged semiconductor chip, which is smaller and less complex, may be less likely to be affected by device/component defects, therefore resulting in higher yield. Furthermore, the packaging of the individual modularized chips may be relatively cheaper compared to packaging for single-chip high-power amplifiers. For example, the packaging of the chips may be relatively cheap surface-mount packaging, such as flat no-leads packages (e.g., QFN) as described herein.

The solution illustrated in FIG. 3 may provide a relatively flexible power amplifier design. For example, whereas fabrication cycles for manufacturing or producing multistage single-chip power amplifier chips may be relatively long (e.g. up to six months or longer), where power amplifiers are constructed from modularized packaged chips as shown in FIG. 3, implementing modifications to power amplifier architecture with respect to the number of stages and/or the number of parallel amplifier units may only require PCB modification. Generally, PCB modification may be achievable in a shorter time frame than wafer fabrication cycling.

The architecture 300 may advantageously have one or more radio-frequency shielding structures, such as one or more lids on the top and/or bottom of the device 300. Furthermore, the system 300 may include one or more interfaces to other systems, such as SMA connectors and/or waveguide transitions. Although the packaged semiconductor chips 351-364 of the power amplifier 300 are described herein as GaN amplifier chips, it should be understood that other semiconductor processes may be utilized. For example, GaAs-based amplifier chips may be used in a modularized power amplifier architecture similar to that shown in FIG. 3 for the purpose of providing greater thermal isolation, as described above. However, such GaAs-based amplifier chips may not be suitable for certain high-frequency, high-power applications. With respect to GaN-based chips, on the other hand, impedances may be relatively higher, such that it is not required to implement significant impedance matching circuitry on the GaN chip itself. That is, GaN amplifier chips in accordance with the present disclosure may have relatively high power density and high-voltage/impedance operation characteristics.

In some embodiments, the individual packaged semiconductor chips of the system 300 can contain or comprise only part of the necessary or desirable input and/or output matching circuitry, or no input or output matching circuitry may be included or implemented within the packages. In such embodiments, any additional power-splitting/combining and/or impedance-matching circuitry can be implemented on relatively cheaper media, such as on the PCB 340. Furthermore, during testing, where modularized packaged semiconductor chips are mounted using surface-mount assembly, repair or rework of a high-power amplifier system may be implemented if problems are encountered. For example, for a modularized high-power amplifier implemented on a PCB, the board can be reused when error/defect with a single chip is encountered by replacing the defective chip on the board.

As described in detail herein, modularized packaged semiconductor chips may be used as building-blocks for constructing high-power amplifiers. Such chips may be cascaded in parallel in order to determine an amount of power-handling capability of the chips. That is, amplifiers having different power levels can be built using modularized packaged amplifier chips mounted and arranged according to different board designs coupling different numbers of chips in parallel. Generally, circuit board design cycles can be cheaper and/or less time-consuming than semiconductor wafer/chip design cycles. When designing and/or manufacturing modularized power amplifier architectures utilizing individual packaged semiconductor chips in accordance with embodiments of the present disclosure, the packaged semiconductor chips may be cascaded in parallel, thereby providing power-level scalability. The packaged semiconductor chips may further be cascaded in series, thereby providing gain-level scalability.

Figure 4C:
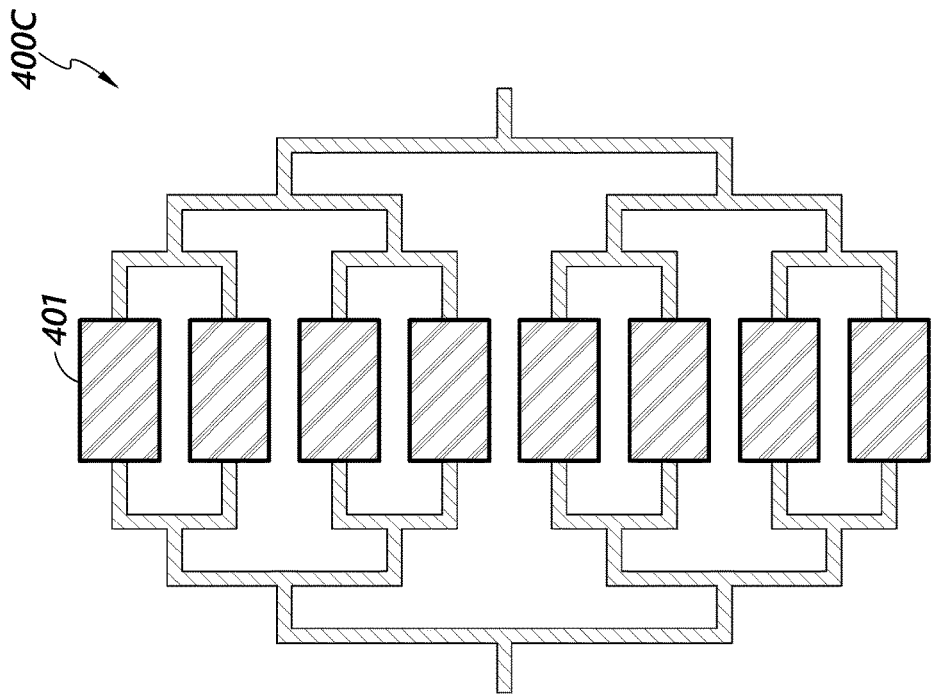
FIGS. 4A-4C illustrate packaged semiconductor chips mounted and arranged in different amplifier architectures having different power levels in accordance with some embodiments.
Figure 4A:
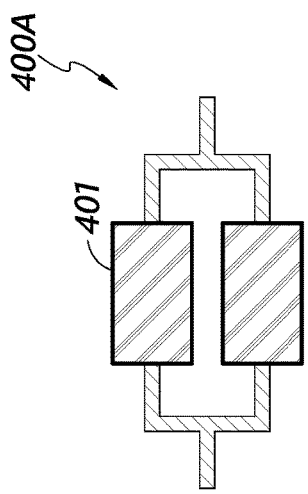
Figure 4B:
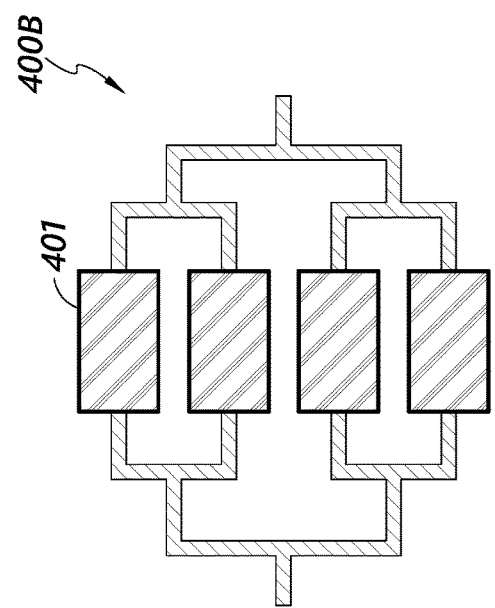

FIGS. 4A-4C illustrate packaged semiconductor chips (e.g., 401) mounted and arranged in different amplifier architectures having different power levels. For example, the power amplifier 400A of FIG. 4A may be capable of relatively lower-power operation compared to the power amplifier 400B of FIG. 4B, which includes a greater number of modularized amplifier chips arranged and connected in parallel than in the power amplifier 400A. The power amplifier 400C includes even more chips arranged on the circuit board in parallel, and therefore provides even greater power-handling operation than the power amplifier 400B of FIG. 4B.

Figure 5B:
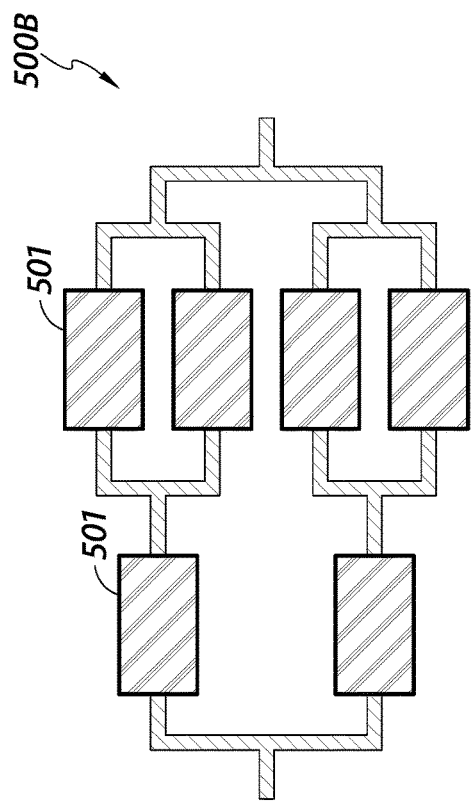
FIGS. 5A-5C illustrate packaged semiconductor chips mounted and arranged in different amplifier architectures having different gain characteristics in accordance with some embodiments.
Figure 5A:
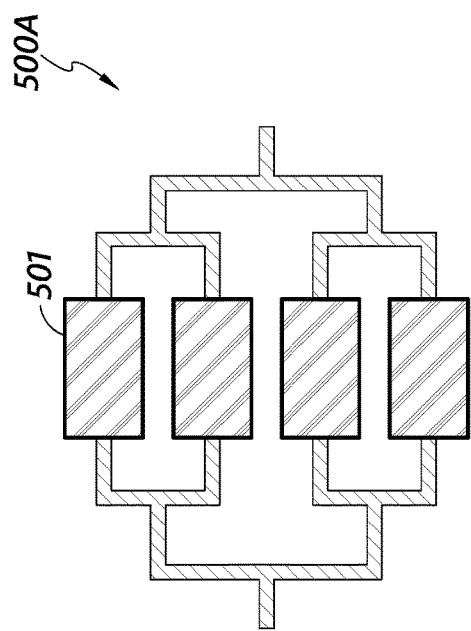
Figure 5C:
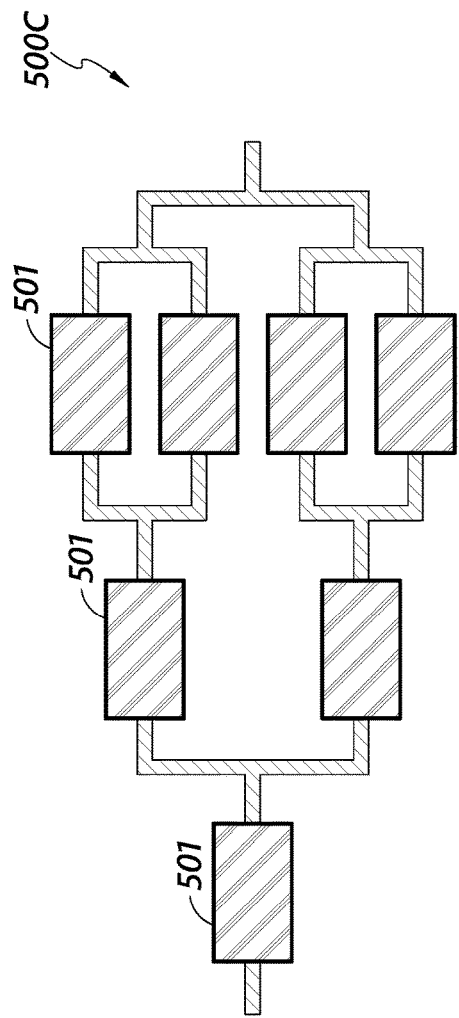

In addition to parallel cascadability, in some embodiments, packaged semiconductor chips can be cascaded in series to produce power amplifiers having desired gain levels. FIGS. 5A-5C illustrate packaged semiconductor chips (e.g., 501) mounted and arranged in different amplifier architectures having different gain characteristics. For example, the power amplifier 500A of FIG. 5A may provide relatively lower gain compared to the power amplifier 500B of FIG. 5B, which includes a greater number of amplifier stages cascaded in series than the power amplifier 500A. The power amplifier 500C of FIG. 5C includes even more stages of amplifiers cascaded in series than the power amplifier 500B, and therefore provides even greater gain than the power amplifier 500B of FIG. 5B.

FIGS. 6A and 6B illustrate top and side views, respectively, of an interface 601 between a semiconductor die 610 (e.g. GaN) and a lead frame 632 associated with a chip packaging. In some embodiments, packaged semiconductor chips in accordance with the present disclosure may have one or more features of the illustrated interface 601 at input and/or output connections thereof. In some embodiments, an input or output interface in accordance with the interface 601 of FIGS. 6A and 6B may form part of a passive matching circuit to provide desirable input and/or output impedance-matching characteristics for a packaged semiconductor chip and/or one or more components thereof. For example, semiconductor chip interfaces and packaging may have associated therewith certain parasitic elements at high-frequency operation. For example, parasitic inductance from the bond wires 636 coupling the semiconductor die 610 to the lead frame 632 may present parasitic inductance. Additional parasitic elements may exist in the form of shunt capacitances and/or other parasitics associated with the packaging itself and/or the footprint of the package. Embodiments of the present disclosure advantageously may include only partial impedance matching, or no matching at all, on the semiconductor die 610. Although some packaging and/or circuitry solutions may involve incorporating additional matching circuitry in order to minimize the effect of parasitic elements, embodiments of the present disclosure may advantageously incorporate the parasitic elements of the packaging and/or interface(s) as parts of the input and/or output matching structure of the chip/package. For example, the lead frame 632, the interface between the lead frame 632 and the circuit board 640, as well as the interface between and the amplifier die 610 and the lead frame 632 can be used as a passive matching circuits to at least partially reduce amplifier die size and/or circuit loss.

FIGS. 6A and 6B show a semiconductor chip packaging mounted on a printed circuit board 640. The packaging includes the lead frame 632 disposed at least partially on a metal layer 607, which may rest on the top surface of the circuit board 640. The metal layer 607 may help to dissipate heat and/or provide grounding functionality for the packaging. In some embodiments, at least some of the components illustrated in FIGS. 6A and 6B may be at least partially encapsulated in plastic or other at least partially rigid material configured and/or designed to house the component(s). The circuit board 640 may have one or more conductive vias 645 therein. A die contact component 611 may electrically couple the die 610 to the wirebonds 636. The die contact 611 may comprise metal or other conductive material.

Generally, utilizing no-leads surface-mount packages (e.g., QFN) at high frequencies (e.g., Ka band) can pose challenges. Therefore, certain embodiments of packaged semiconductor chips may incorporate some amount of matching circuitry on the internal semiconductor die (e.g., GaN), as well as some amount of matching circuitry implemented on the printed circuit board on which the package is mounted, which may be relatively inexpensive. In some embodiments, a semiconductor chip interface may comprise a number of wirebonds 636 designed to provide desired matching functionality. For example, the single interface 610 between the semiconductor die 610/die contact 611 and the lead frame 632 may utilize four or more wirebonds 636, as shown. In some embodiments, three wirebonds are implemented to couple the die contact 611 to the lead frame 632. In the embodiment of FIGS. 6A and 6B, two leads 632a, 6302b are each coupled to a plurality of bondwires 636a, 636a, respectively. Such additional leads and/or wirebonds may serve to overcome the difficulties of using a standard no-leads packaging at relatively high frequencies. Generally, at high frequencies, it may be impractical to use certain surface-mount no-leads packages due to the parasitics associated with such a packaging.

Implementing modularized high-power amplifier architectures using discrete packaged semiconductor chips, as described herein, can present certain challenges. For example, configuring input (e.g. gate) and/or output (e.g., drain) bias injection in a suitable or desirable way that allows for the individual packaged semiconductor chips to be cascaded in series to provide the desired gain and/or in parallel to provide desired power levels may be necessary or desirable. The lead frame and the amplifier die of a packaged semiconductor chips can be configured to daisy-chain the input/gate bias connections such that the packaged semiconductor chips can be relatively easily arranged in a typical power-splitting/combining network.

Figure 7:
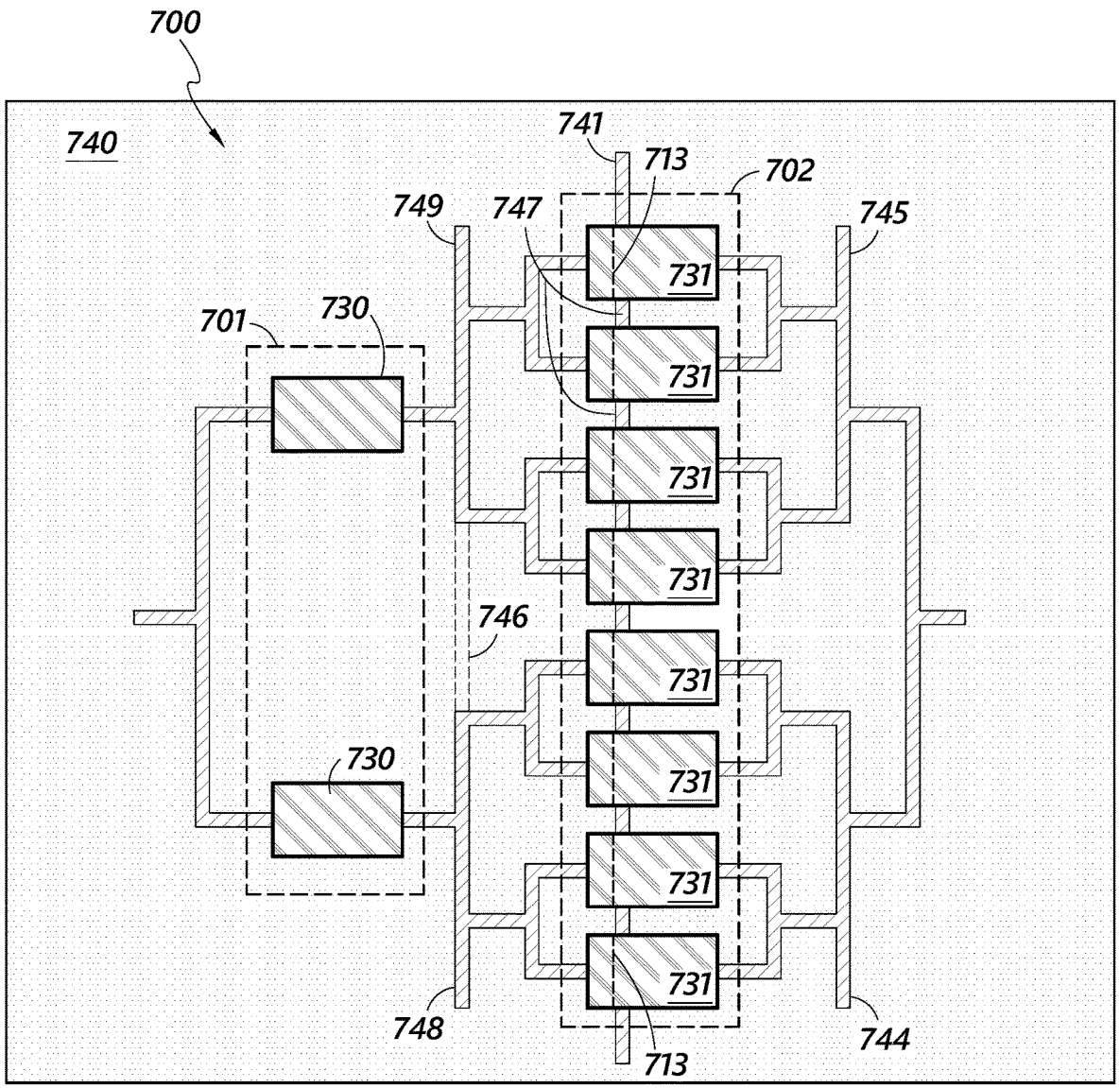
FIG. 7 shows a power amplifier architecture in accordance with one or more embodiments.

In some embodiments, amplifier architectures of the present disclosure are configured such that input/gate bias voltage is applied via a bias injection network that is configured to be interconnected to parallel chips, as shown in the example amplifier architecture 700 of FIG. 7. In some embodiments, stability circuitry is included on the semiconductor die of the individual packaged semiconductor chips, such that no external bypassing is required.

In the amplifier architecture 700 of FIG. 7, each of the packaged semiconductor chips 730, 731 may comprise a relatively small semiconductor (e.g., GaN) die contained in a QFN package. The chips 730 may be arranged in a power-splitting and/or -combining network, as shown in FIG. 7. separately mounted on a printed circuit board (PCB) 740 in accordance with one or more embodiments of the present disclosure.

The power amplifier architecture 700 of FIG. 7 shows an amplifier stage 702 comprising a plurality of parallel semiconductor chips 731. The semiconductor die within each of the packages 731 may advantageously be configured to support passing an input bias (e.g. gate bias) from one side of the respective package to the other, such that the input bias signal can be daisy-chained across the parallel chips 731. For example, inter-package connection 747 may electrically couple the chip packages to one another, wherein an input bias signal provided on the path 747 may be passed between the parallel chips. In addition, the semiconductor die within each of the packages 731 may include a signal routing network for providing the input bias signal through the package from one side to another side thereof. For example, with respect to the orientation of FIG. 7, one side of the packages 731 may face a top of the page, whereas the opposite side of the packages 731 may face the bottom of the page. Using the inter-package on-board routing 747 in combination with the intra-package routing 713, a bias signal (e.g., an input/gate bias signal) provided on the path/terminal 741 may be passed to all of the parallel packaged semiconductor chips 731. Therefore, the input/gate bias may be provided in a daisy-chain manner for parallel-connected amplifier packages.

The amplifier architecture 700 may further comprise provision of output (e.g., drain) bias coupling on one or more output paths, such as in the output networks of the PCB board 740. For example, with respect to a two-stage architecture similar to the architecture 700 shown in FIG. 7, drain bias connections 749, 748 may be provided at output paths of the first stage 701 of the power amplifier 700, whereas output bias connections 744, 745 may be provided at output paths of the second stage 701. Although symmetrical output bias connections are shown in FIG. 7, in some embodiments, a single output/drain bias connection may be used for each amplifier stage, or more than two output bias connections may be associated with each amplifier stage. With respect to the output network from the first stage 701, it may be necessary to include at least two output bias connections in order to ensure that the branch output from each of the first stage chip packages 730 is coupled to the bias signal. Additionally or alternatively, in some embodiments, a board connection 746 may connect the output branches of each of the chip packages 730 of the stage 701 together to thereby provide common output biasing thereto. With respect to the on-board output network from stage 702, a single output bias connection may be sufficient due to the interconnectivity of the outputs of the chip packages 731 and the output connection network, as shown. The illustrated symmetrical output bias connections may be desirable in order to manage output current in a desirable manner Although FIG. 7 shows input biasing provided in a daisy-chain manner and output biasing provided from traces on the circuit board 740, it should be understood that in some embodiments the output biasing signals may be provided in a daisy-chain manner, whereas the input bias may be provided using on-board traces. It may be desirable for the input biasing to be configured in a daisy-chain configuration, as opposed to the output biasing, due to the relatively smaller amount of current at the input of the packaged chips compared to the output thereof.

In order to implement the modularized architecture of FIG. 7, as referenced above, certain internal bias connections may be necessary or desirable on the internal die of the respective packaged chips. By including internal bias connections as described below, additional external connections may not be necessary, thereby allowing for simplified power amplifier design/construction. In embodiments in which the packaged semiconductor chips include a multi-stage power amplifier die, the output/drain bias terminals of the amplifier stages can be chained together on the semiconductor die within the packaged semiconductor chips. In doing so, it may not be necessary to provide drain bias connections to individual stages, which can be relatively costly with respect to semiconductor die area and/or assembly complexity.

As described above, improved thermal isolation may be achieved in the modularized architecture 700 of FIG. 7. For example, in a single packaged semiconductor chip, the thermal energy/heat may be concentrated in a relatively small area. By dividing the active power amplifier functionality of the system 700 over a large area and over a number of physically-separated chips, the heat dissipation for the system 700 is generally spread out over a larger area of the system 700, which may improve performance and/or product lifetime. In some embodiments, the packaged semiconductor chips can permit heat transfer mechanisms from both the top and/or bottom layers or regions of the package. In some embodiments, the heat transfer mechanism(s) implemented to dissipate heat from the top of the package may be incorporated into a metal lid (not shown) of the system/device 700, which may provide further heat transfer from the system and serve as an electrical/radio-frequency shield and/or mechanical protection. In some embodiments, the system 700 includes a lid on one or both of the top and bottom regions of the system 700. Such lid(s) may be designed to form walls between the individual packages and/or groups of packages, to thereby provide electrical isolation. Front and/or backside lid(s) of the high-power amplifier system 700 can include features for providing proper interfaces to one or more other systems. For example, a topside lid may have a waveguide opening associated therewith, whereas a backside lid may have a back-short cavity to interface the high-power amplifier system 700 with one or more waveguides.

Figure 8:
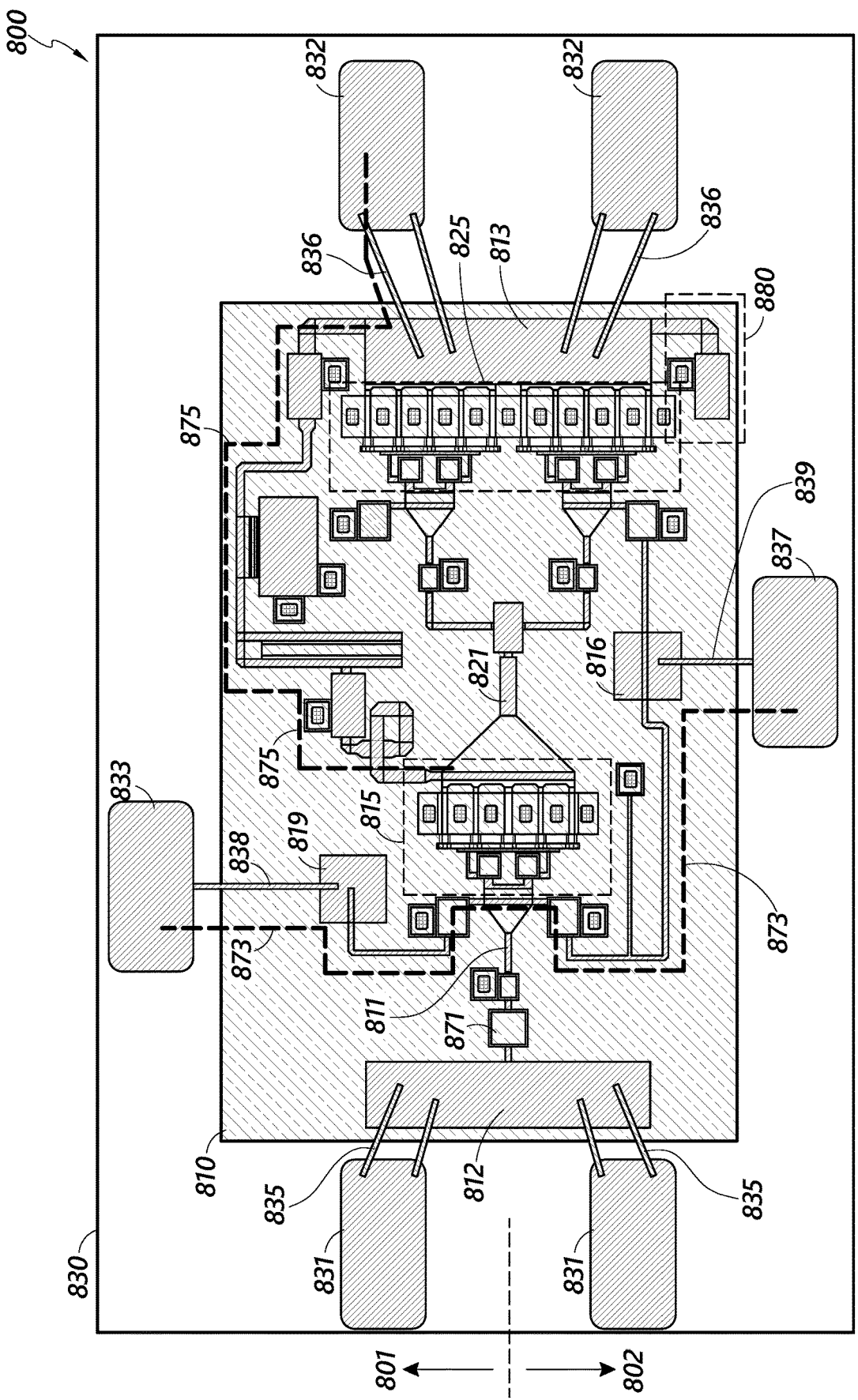
FIG. 8 illustrates a plan layout of a packaged semiconductor chip for a modularized high-power amplifier in accordance with one or more embodiments.

FIG. 8 illustrates a plan layout of a packaged semiconductor chip 800 for a modularized high-power amplifier in accordance with one or more embodiments of the present disclosure. The packaged semiconductor chip 800 of FIG. 8 comprises a lead frame including a plurality of pins, which may be leveraged to receive RF input signals, as well as certain DC bias signals. For example, a first pad 833 of the lead frame may be used to receive an input (e.g., gate) bias signal from a circuit board connection on one side 801 of the package 830, wherein the bias signal may be coupled to a DC pad 819 formed on the substrate 810 using one or more wirebonds 838, or other type of electrical connection. The input bias may be further routed from the DC pad 819 to the input terminal 811 of the parallel-configured transistors 815, and further to a DC pad 816 on an opposite side 802 of the parallel-configured transistors 815. The DC pad 816 may be coupled to another pin 837 of the lead frame by one or more wirebonds 839. The pins 833 and 837 may advantageously be pins disposed on opposite sides 801, 802 of the parallel-configured transistors 815 and/or package 830, such that the routing path 873 between the pins 833, 837 on the substrate 810 allows for the input bias signals to be received from the circuit board on which the packaged semiconductor device 800 is mounted at the pin 833 and further output at the pin 837 on the opposite side 802 of the chip package 830. As described above, the coupling path 873 coupling the input/gate bias input 833 and output 837 pins may allow for daisy-chaining of the packaged semiconductor chip 800 in parallel, as described in detail herein. For example, when two packaged semiconductor chips in accordance with embodiments of the present disclosure are placed side-by-side in a parallel configuration, a simple non-board connection between the input/gate voltage pin connection of one side of one of the packages and the input/gate voltage pin connection of an opposite side of the other package can allow for input (or output) bias daisy-chaining, such that multilayer circuit board routing is not required to cascade the chips in parallel and/or series.

The packaged semiconductor chip 800 may advantageously comprise DC-blocking circuitry 871 between the RF input pad 812 and the input terminal 811 of the parallel-configured transistors 815. The DC-blocking circuitry 871 may comprise one or more capacitors and/or other passive circuit elements. The DC-blocking circuitry 871 may serve to block any DC output bias signal that may be present at the input pad 812 of the substrate 810 from an output bias signal associated with the previous stage of a modularized power amplifier architecture in accordance with embodiments of the present disclosure. Therefore, in some embodiments, the RF input to the substrate 810 may be DC-blocked, while the RF output is not DC-blocked, such that the output/drain bias voltage can be injected in an RF splitter/combiner network implemented on the circuit board without requiring additional off-chip DC-blocking circuitry. In some embodiments, the output may be DC-blocked, whereas the input is not-DC blocked.

In some embodiments, a multi-stage amplifier may be implemented on the substrate 810. Adding an additional amplifier stage may provide a more efficient use of the semiconductor substrate 810 (e.g. GaN die) compared to embodiments having only a single stage amplifier due to substrate losses during wafer singulation. The packaged semiconductor chip 800 may further comprise output bias coupling 875 between amplifier stages of the substrate 810. For example, an output bias signal may be received at one or more of the output pins 832 of the lead frame. The output pin(s) 832 may be coupled to the output pad 813 of the substrate 810 using one or more wirebonds 836, as shown. The output (e.g. drain) bias signal received at the output pad 813 via the bond wires 836 and output pin(s) 832 may be routed 875 on the substrate 810 from the output of the second stage 825 of the amplifier to the output 821 of the first stage 815 of the amplifier. Therefore, in some embodiments, the output/drain bias of all stages of the amplifier implemented on the substrate 810 are connected or chained together on the substrate 810. In some embodiments, the substrate 810 comprises some amount (e.g., a minimal amount) of matching circuitry 880 for providing output matching for the chip 800. With a minimal amount of on-chip matching circuitry 880, the additional required or desired matching circuitry may be realized in, or using, the package interface parasitic elements, as described above. In some embodiments, the semiconductor substrate 810 comprises one or both of reflection stability circuitry and loop stability circuitry implemented thereon.

Since the amplifier (e.g. GaN) substrate 810 is relatively small compared to a multi-stage high-power amplifier implemented on a single semiconductor die, wherein the power amplifier architecture may be constructed using many identical chips similar to the chip 800, design effort associated with the high-power amplifier can advantageously be focused on optimizing the size and/or performance of a single relatively small chip (e.g. chip 800), wherein the benefits achieved through such optimization may be amplified by the number of packaged semiconductor chips utilized in the high-power amplifier architecture. For example, if a high-power amplifier architecture comprises 10 individual packaged semiconductor chips, wherein a certain cost savings is achieved for the packaged semiconductor chip design, such savings may translate to a 10-fold savings relative to the whole high-power amplifier system. Furthermore, because the size of the chip 800 is relatively small, the yield of the amplifier substrate 810 can be significantly higher than for a high-power amplifier architecture implemented with many more active devices on a single relatively large die/substrate (e.g. GaN).

Although certain interfacing technologies are described herein, it should be understood that any interfacing technology may be used to interface a semiconductor (e.g., GaN)

amplifier die in accordance with the present disclosure to a circuit board, substrate, and/or packaging material. Such alternative interfacing technologies include, but are not limited to, flip-chip technology and die backside patterning with signal via. For example, flip-chip technology may be used to interface the amplifier die 810 with a no-leads package, or with a printed circuit board directly. In such cases, directing heat away from the amplifier die 810 may be relatively more difficult. Furthermore, assembly may be relatively more complex, and oscillation may occur due to insufficient grounding in some implementations. Furthermore, such interfacing technologies may put limits on the thickness of the die/wafer. In some embodiments, flip-chip technology may be used on the backside of the die 810 using standard bumping techniques and signal vias. Although printed circuit boards are described herein, it should be understood that materials other than standard printed circuit boards may be used to combine packaged semiconductor chips together in power amplifier architectures as described herein.

In some embodiments, high-power amplifier systems can utilize quadrature switching architecture to provide switching functionality without requiring a switching circuit at the output and/or input of the system. Such switching functionality may be realized by turning on or off appropriate portions of the amplifier system, which may reduce output loss and/or increase output power and power added efficiency. Furthermore, by avoiding the use of a switching circuit component, additional savings may be achieved with respect to component cost, simplicity, and/or yield.

Figure 9:
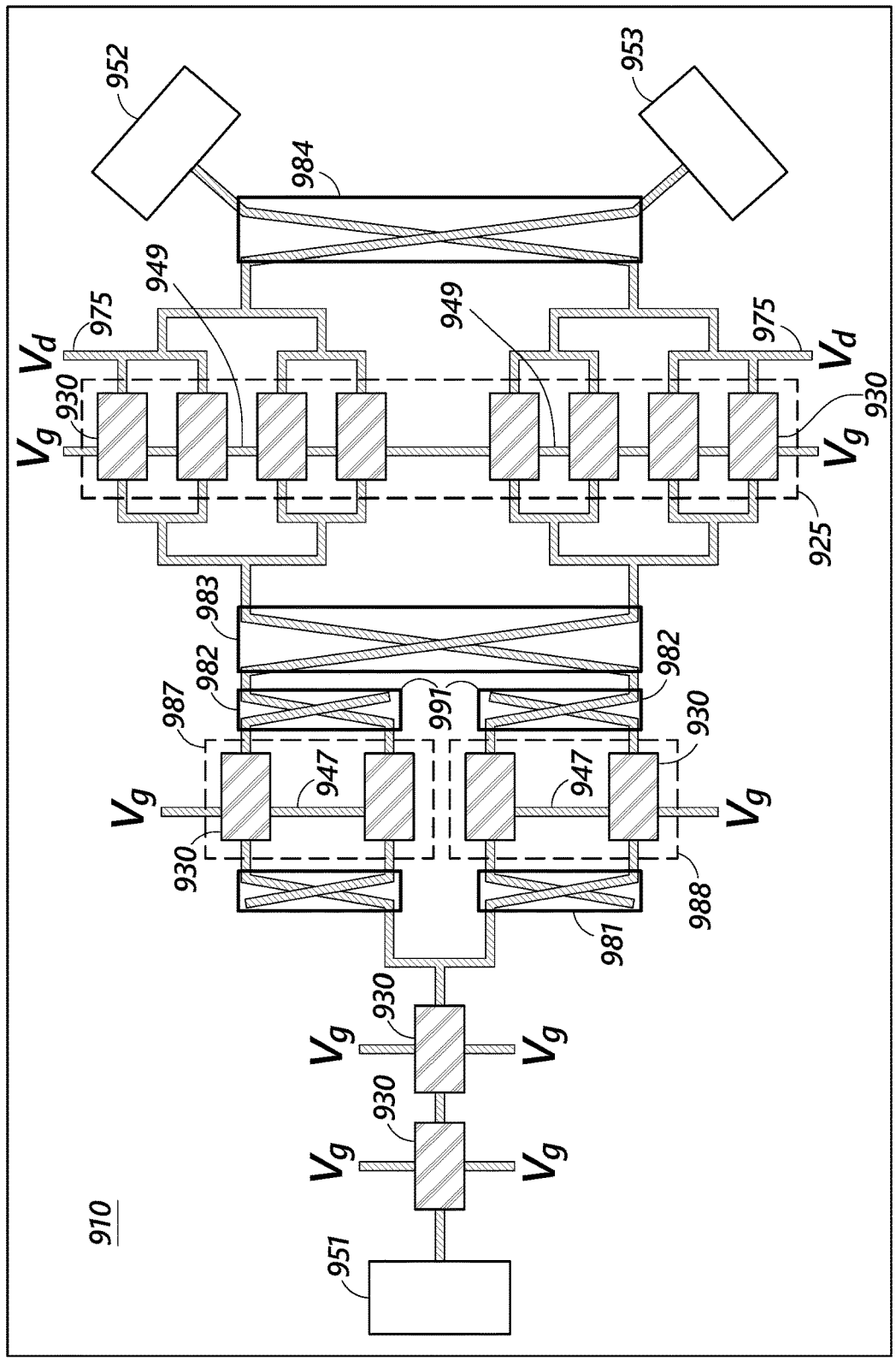
FIG. 9 illustrates an architecture for a modularized quadrature switching device in accordance with one or more embodiments.

FIG. 9 illustrates an architecture for a modularized quadrature switching device 900 including a plurality of packaged semiconductor amplifier chips and a plurality of 90° hybrid devices. A switch like that shown in FIG. 9 utilizes proper phasing to achieve selective output on one of two output terminals 952, 953. For example, the quadrature switching architecture 900 may be used as an electronic polarity switch, which may be configured to switch from right-hand circular to left-hand circular polarization dependent on the states of the groups of amplifiers 987 and 988. For example, when the amplifiers 987 are in an ON configuration and the amplifiers 988 are in an OFF configuration, the RF output signal may be provided at the RF output port 953, whereas when the amplifiers 987 are in an OFF configuration and the amplifiers 988 are in an ON configuration, the RF output signal may be provided at the RF output port 952. In order to implement such functionality, the 90° hybrid devices (e.g., 983) may be configured to sum the signal power at the respective RF output port. A quadrature switching architecture like that of FIG. 9 may be particularly desirable or applicable for relatively high-power applications in order to reduce losses. Furthermore, implementing a quadrature switching architecture in a modularized configuration as shown in FIG. 9 may provide improved isolation between output paths compared to single-chip switch devices. In some embodiments, DC bias signals can be fed into the circuit 900 through the isolated port of a 90° hybrid circuit.

In the architecture 900, the packaged semiconductor amplifier chips 930 can advantageously be daisy-chained in parallel with respect to input/gate bias connections and signals and/or output/drain bias connections and signals using on-board traces configured to inject the bias signal in the output paths of the packaged semiconductor chips 930. In the amplifier stages, such as the amplifier stage 925, the output/drain bias signal may be injected at terminal(s) 975. With respect to the amplifier stage 987, 988, the output/drain bias may be injected at an isolated port 991 of respective 90° hybrid devices 982. In embodiments in which the individual packaged semiconductor chips 930 include multiple amplifier stages, coupling between outputs of the stages may be implemented on the semiconductor die within the chip package, as described above with respect to FIG. 8.

With respect to input/gate biasing, the individual packaged semiconductor chips 930 may have internal pin-to-pin input/gate bias coupling paths, as described in detail above the respect FIG. 8. For example, contact pins of the lead frames of the packaged semiconductor chips on opposite sides thereof may be coupled through the input of the amplifier to allow for daisy-chaining, as described in detail above. In some implementations, the modularized quadrature switching architecture 900 of FIG. 9 may be implemented with a radio-frequency isolation wall or structure between upper and lower halves of the switch.

With reference back to FIG. 2, modularized packaged semiconductor chips in accordance with the present disclosure may advantageously include, or be connected to, input and/or output matching circuitry in order to provide desirable input and/or output matching for efficient power amplifier operation. In some implementations, the semiconductor die interface impedance may be non-standard (i.e., impedance other than 50 ohms), which may allow for only part of the RF matching circuitry to be implemented on the semiconductor die. For example, in some embodiments, a semiconductor die (e.g., GaN die) of a modularized packaged semiconductor chip in accordance with embodiments of the present disclosure does not have on-die matching circuitry for input and/or output impedance matching, and therefore an impedance higher or lower than 50 ohms may be presented at the input of the chip and/or expected at the output of the chip.

Figure 10:
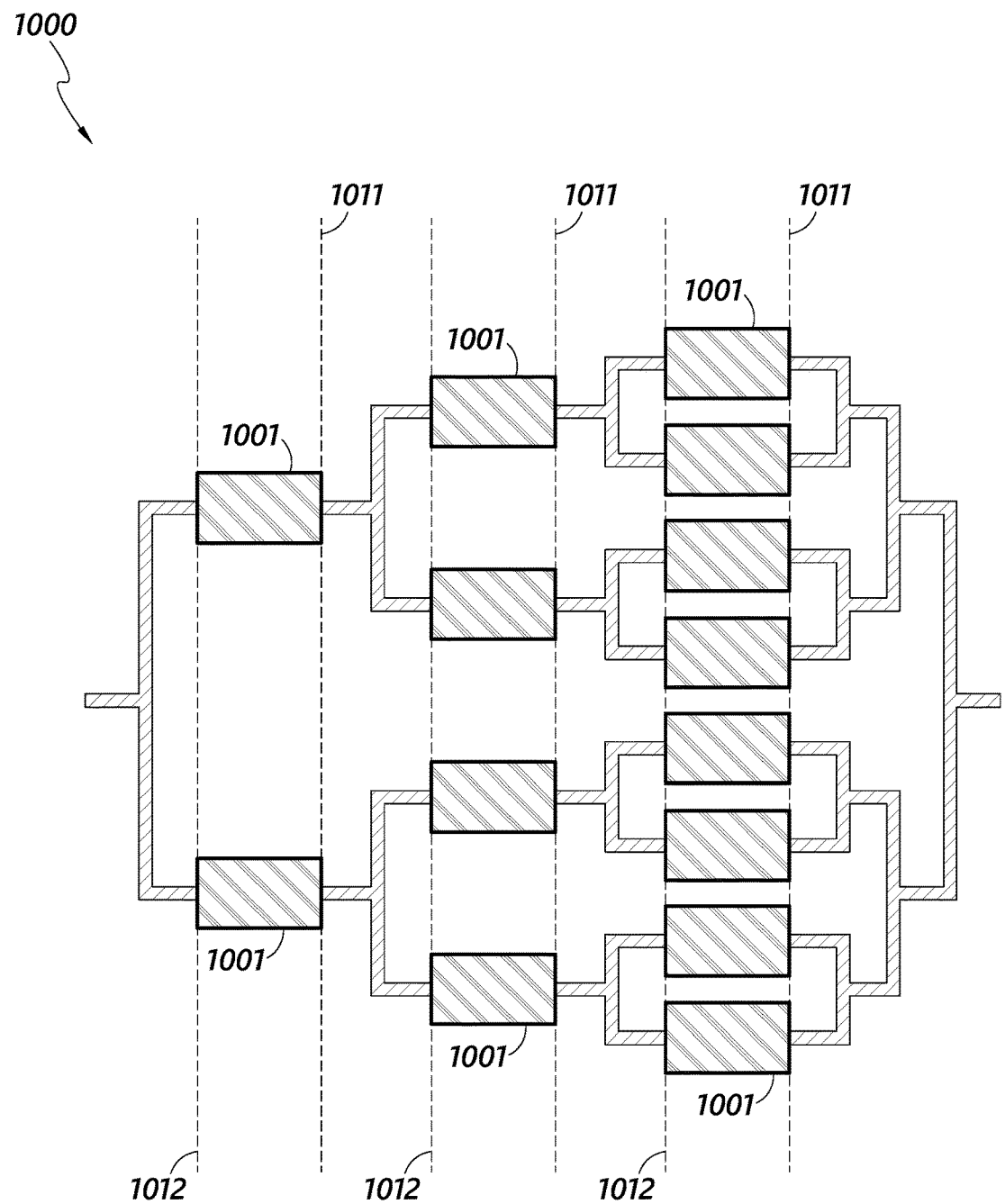
FIG. 10 illustrates a modularized amplifier architecture in accordance with one or more embodiments.

FIG. 10 illustrates a modularized power amplifier architecture in accordance with embodiments of the present disclosure, wherein input 1012 and output 1011 impedance interfaces for the various amplifier stages are identified. In some embodiments, a desirable input impedance match may be realized at least in part in the individual packaged semiconductor chips through package parasitics at high-frequency operation. Each of the packaged semiconductor chips may be designed to have a standardized power match impedance, which may differ from standard 50-home input/output impedances. This way, packaged chips designed by separate manufacturers may be usable substantially interchangeably in some implementations.

In some embodiments, a modularized packaged semiconductor chip in accordance with embodiments of the present disclosure comprises an amplifier semiconductor substrate of a first type (e.g. GaN amplifier die or other relatively high-cost semiconductor process die) as well as input and/or output matching circuits implemented on one or more separate semiconductor substrates of one or more other types used for input and/or output matching circuits (e.g., GaAs) within a single package.

Figure 11:
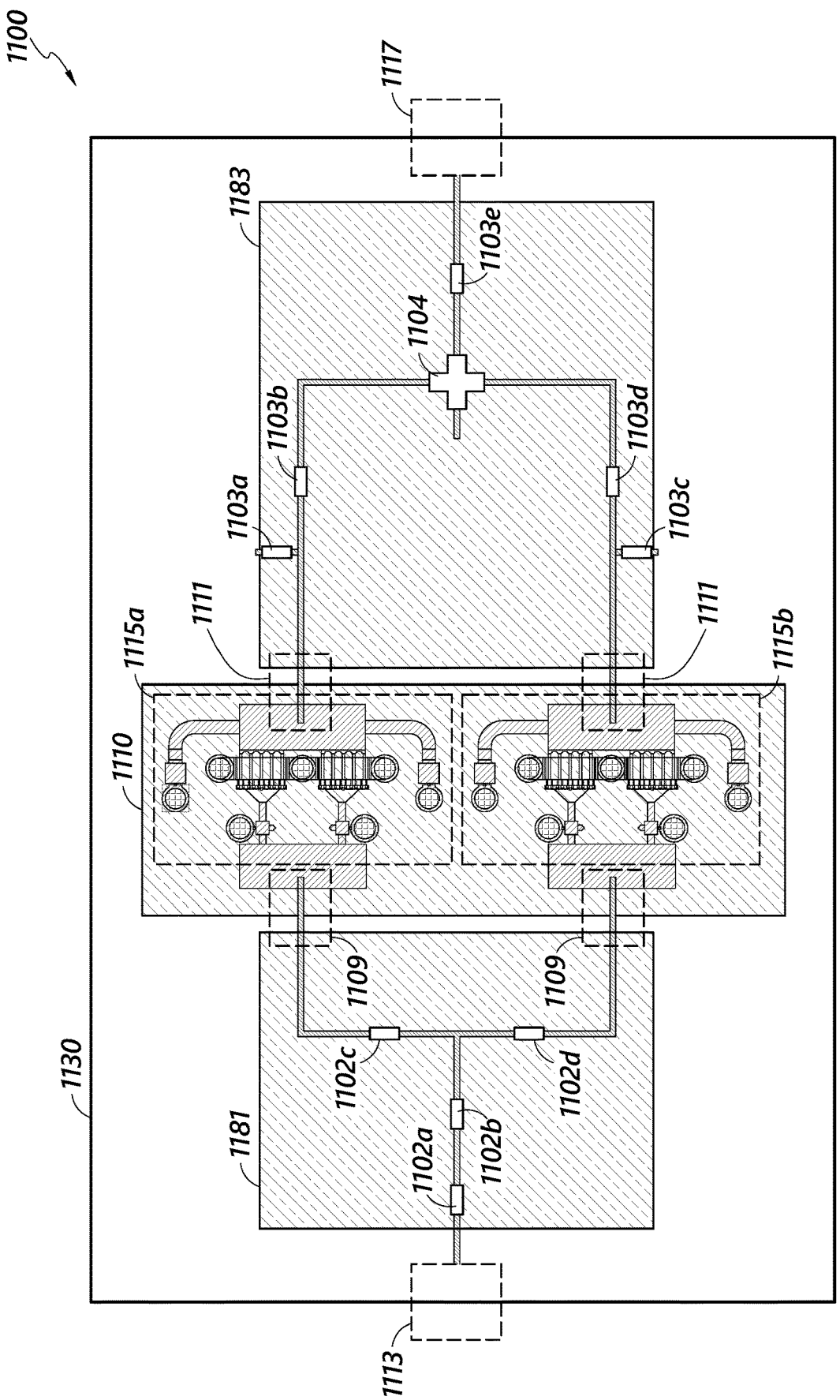
FIG. 11 illustrates a packaged semiconductor chip including separate amplifier and matching die within a single package in accordance with one or more embodiments.

FIG. 11 illustrates a packaged semiconductor chip 1100 including separate amplifier and matching die within a single package in accordance with one or more embodiments of the present disclosure. The packaged semiconductor chip 1100 includes an amplifier die 1110 including one or more amplifiers. For example, in the illustrated embodiment, the amplifier die 1110 (e.g., GaN die) includes parallel amplifiers 1115a and 1115b. Although two amplifiers are shown, it should be understood that the principles disclosed herein are applicable to amplifier die having any number of amplifiers implemented thereon. The amplifier die 1110 may advantageously comprise a two-stage amplifier, as described herein.

The packaged semiconductor chip 1100 includes an input matching die 1181 having implemented thereon input matching circuitry, which may include one or more transmission lines, tapers, combiners/splitter, and/or other types of passive devices, including capacitors, resistors, inductors, and the like. For example, in the illustrated embodiment, the input matching die 1181 includes a plurality of transmission lines 1102. The input matching die 1181 may advantageously have an interface 1113 for electrically coupling to a printed circuit board (PCB) on which the packaged semiconductor chip 1100 is mounted. For example, the interface 1113 may be similar in certain respects to the interface 601 shown in FIGS. 6A and 6B and described in detail above. The input matching die 1181 may further comprise one or more interfaces 1109 for electrically coupling to the power amplifier die 1110. Such interfaces are described in greater detail below in connection with FIGS. 12A and 12B.

The packaged semiconductor chip 1100 may further comprise an output matching die 1183 having implemented thereon output matching circuitry, which may include one or more transmission lines, tapers, combiners, splitters, and/or other types of passive devices, including capacitors, resistors, inductors and/or the like. For example, in the illustrated embodiment, the output matching die 1183 includes a plurality of transmission lines 1103, as well as a power combiner 1104. The output matching die 1183 may advantageously have an interface 1117 for electrically coupling to the PCB on which the packaged semiconductor chip 1100 is mounted. For example, the interface 1117 may be similar in certain respects to the interface 601 shown in FIGS. 6A and 6B and described in detail above. The output matching die 1183 may further comprise one or more interfaces 1111 for coupling to the power amplifier die 1110. Such interfaces are described in greater detail below in connection with FIGS. 12A and 12B. The configuration of FIG. 11 may advantageously provide relatively large gain in a single package, thus potentially lessening concerns or issues associated with additional losses of on-board implemented impedance-matching circuitry.

Figure 12B:
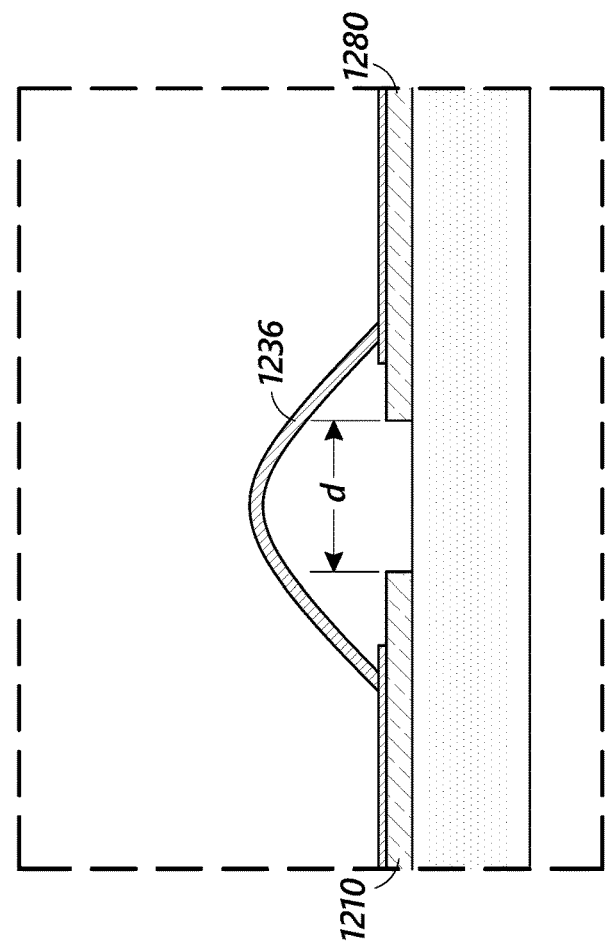
FIGS. 12A and 12B illustrate top and side views, respectively, of an interface between semiconductor die in accordance with one or more embodiments.
Figure 12A:
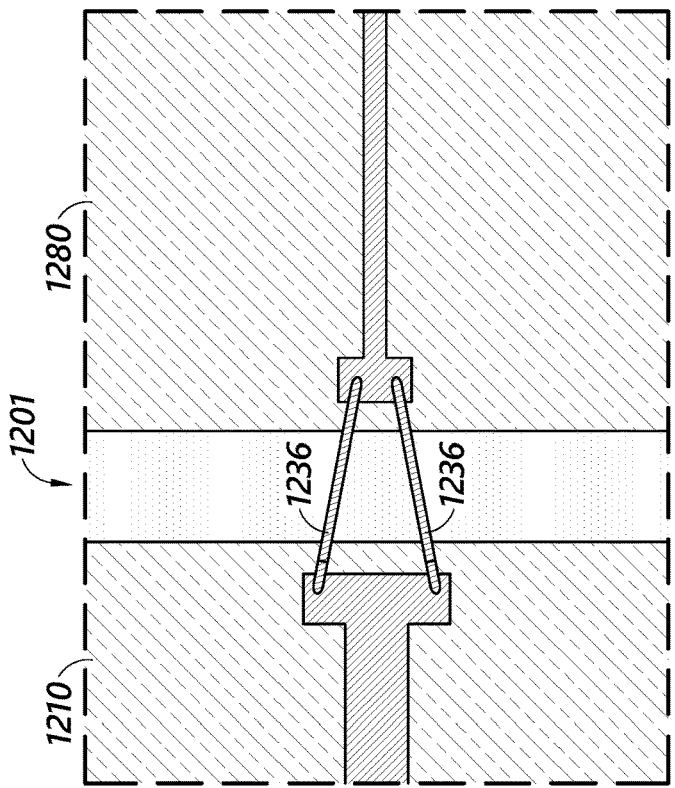

FIGS. 12A and 12B illustrate top and side views, respectively, of an interface between a power amplifier die 1210 of a first semiconductor type (e.g., GaN) and a matching circuit die 1280, which may comprise a different semiconductor substrate, such as a relatively lower-cost substrate (e.g., GaAs). In some embodiments, packaged semiconductor chips in accordance with embodiments of the present disclosure may have one or more features of the illustrated interface 1201 between an amplifier die and an input matching die and/or output matching die. In some embodiments, the interface 1201 may form part of a matching circuit for the amplifier die 1210.

The power amplifier die 1210 and the matching circuit die 1280 may be coupled using one or more bondwires 1236, as illustrated. The power amplifier die 1210 and the matching circuit die 1280 may be disposed any suitable or desirable distance d apart. For example, in some embodiments, the amplifier die 1210 and matching circuit die 1280 are spaced approximately 5 mm apart.

Figure 13:
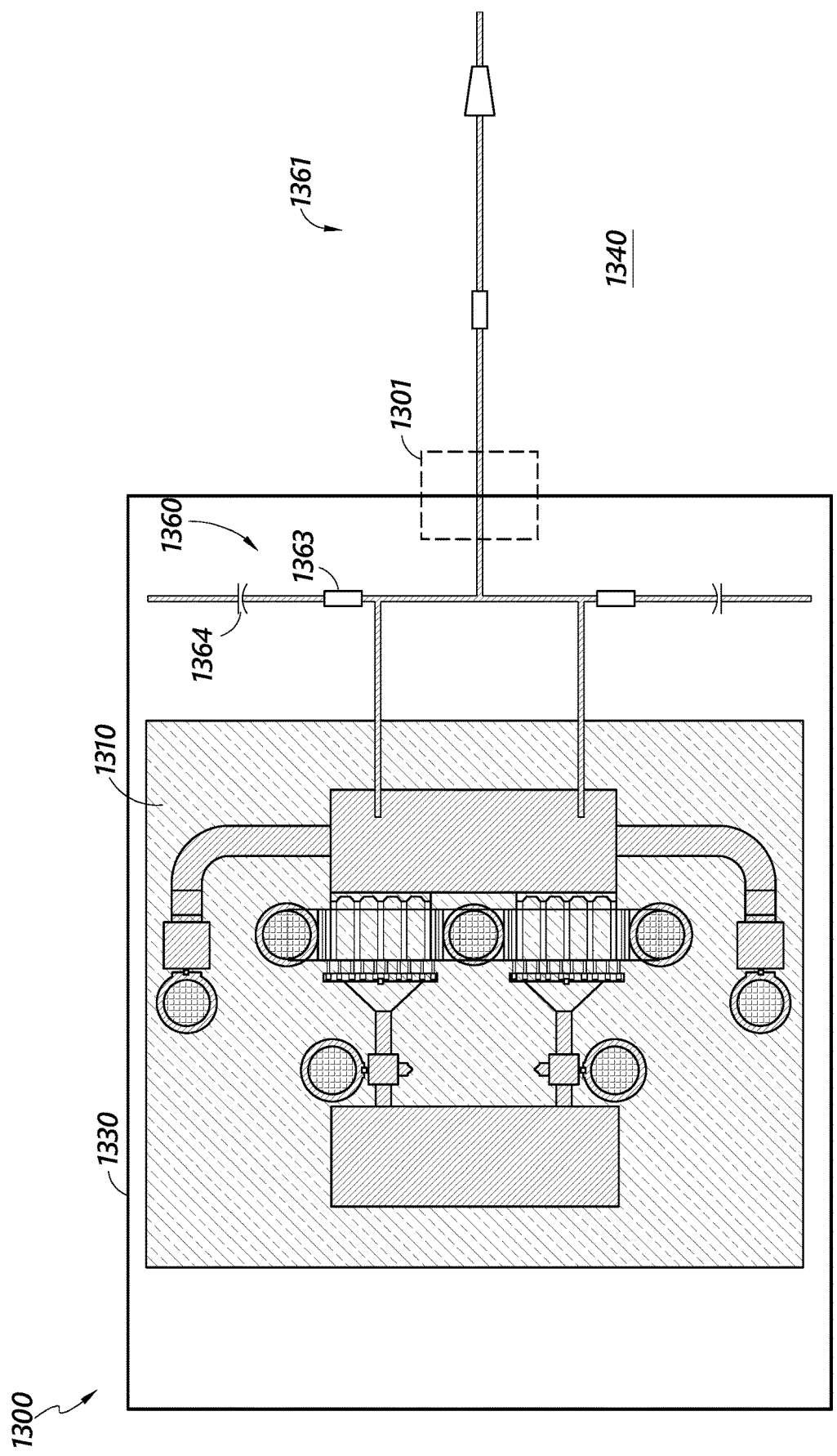
FIG. 13 illustrates a packaged semiconductor chip having both on-chip and off-chip matching in accordance with one or more embodiments.

In some embodiments, a packaged semiconductor chip in accordance with embodiments of the present disclosure includes a power amplifier semiconductor die having some amount of pre-matching implemented on the amplifier semiconductor die, wherein no additional matching circuit die are included in the package. FIG. 13 illustrates a packaged semiconductor chip 1300 having both on-chip 1360 and off-chip 1361 impedance matching in accordance with one or more embodiments of the present disclosure. In some embodiments, the power amplifier substrate 1310 includes one or more transmission lines, capacitors, resistors, and/or other passive elements implemented thereon for impedance matching. The package 1330 may be mounted to a circuit board 1340 having implemented thereon additional matching circuitry 1361, which may include one or more transmission lines, tapers, and/or other passive matching elements. The matching circuitry 1361 may be implemented on the board 1340 and/or in another packaged chip mounted on the board 1340.

In some embodiments, the packaging features and wire-bond interface 1301 may be configured to perform some of the radio-frequency matching functionality, whereas the remaining matching functionality may be implemented through radio-frequency splitting/combining and/or other passive elements implemented on the internal power semiconductor substrate 1310 of the packaged semiconductor chip 1300. In some embodiments, the on-chip matching circuitry 1360 comprises one or more capacitors 1364 and one or more transmission lines 1363.

For modularized high-power amplifier architectures in accordance with embodiments of the present disclosure, impedance matching may be achieved using one or more matching elements implemented in the connectivity circuitry on the circuit board between the individual packaged semiconductor chips.

Figure 14:
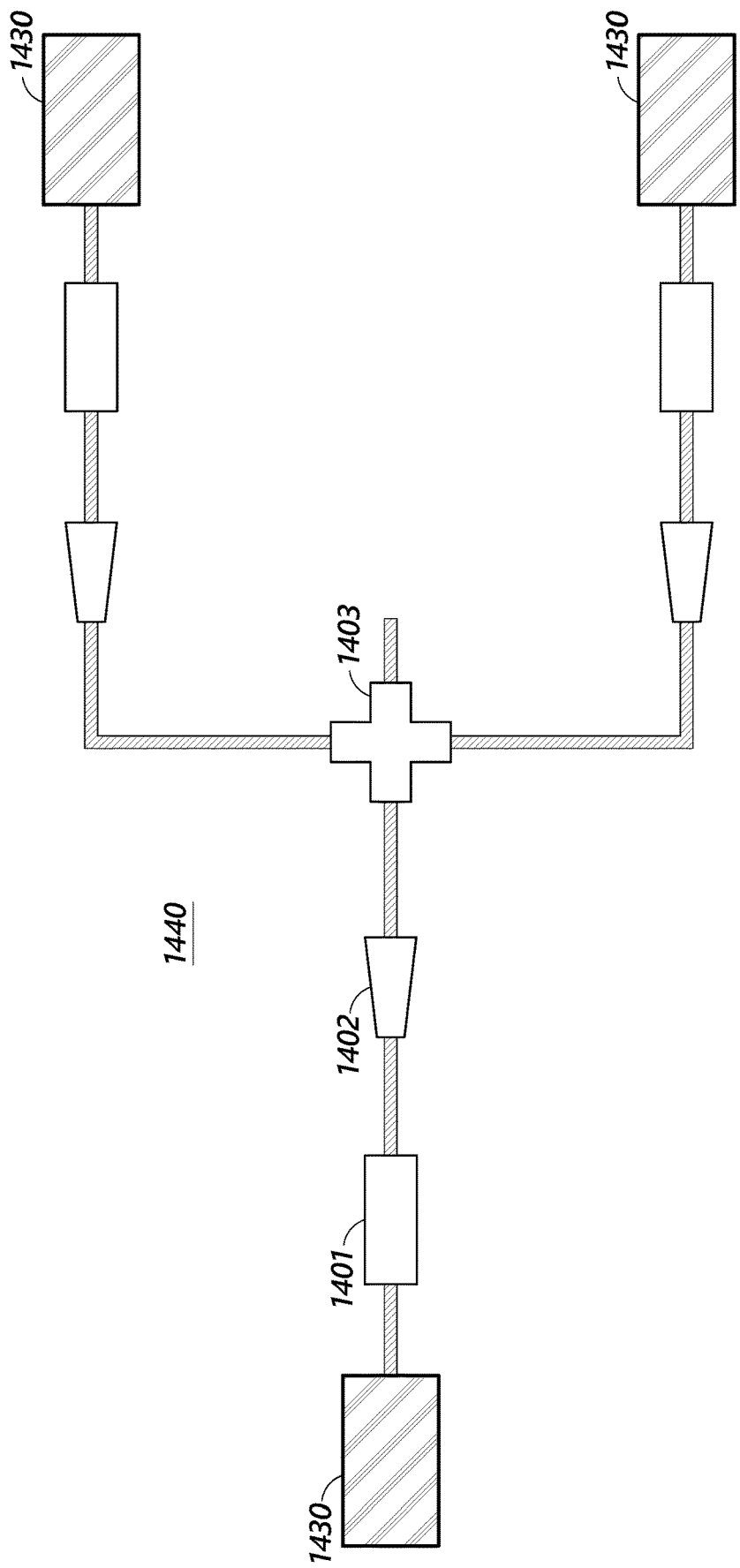
FIG. 14 illustrates on-board matching between packaged amplifier chips in a modularized high-power amplifier architecture in accordance with embodiments.

FIG. 14 illustrates on-board matching between packaged amplifier chips 1430 in a modularized high-power amplifier architecture in accordance with embodiments of the present disclosure. In some embodiments, inter-stage matching is implemented between packaged semiconductor amplifier chips in connectivity circuitry between amplifier stages and/or chips. For example, between amplifier stages, on-board matching circuitry in accordance with embodiments of the present disclosure may comprise, in addition to one or more splitters/combiners 1403, one or more transmission lines 1401 and/or tapers 1402. Such transmission lines and/or tapers may have any suitable or desirable width and/or impedance characteristics, and may be designed to match the particular input and/or output loads and impedances of the chips 1430.

Figure 15:
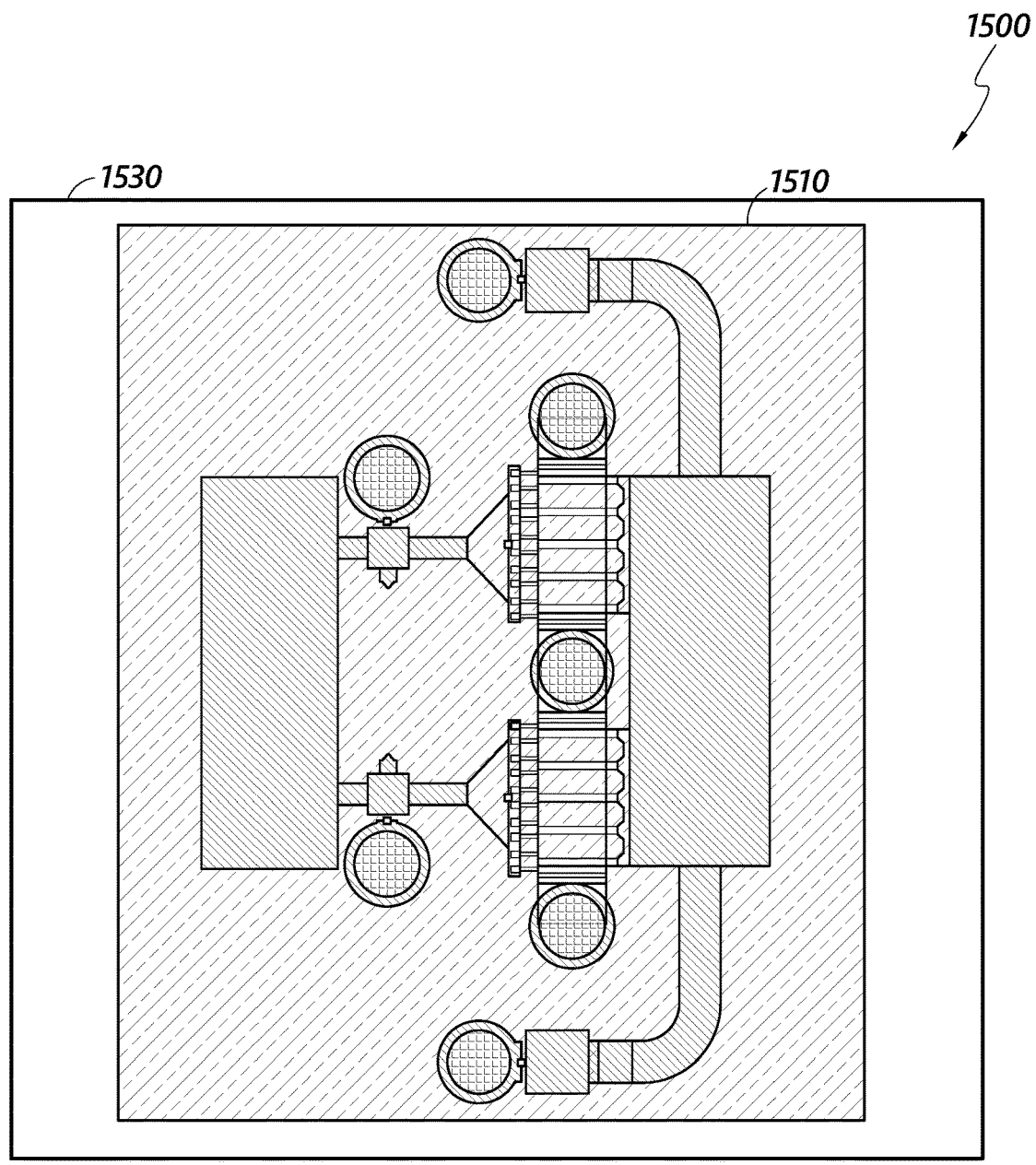
FIG. 15 illustrates a single-stage power amplifier die in accordance with one or more embodiments.

As described herein, embodiments of packaged semiconductor chips in accordance with aspects of the present disclosure may comprise a single-stage power amplifier die (e.g. GaN die) in a no-leads package. Such single-stage amplifier die may be implemented in any suitable or desirable way. FIG. 15 illustrates an example implementation of a single-stage power amplifier die including a semiconductor substrate 1510 implemented in a chip package 1530. Packaged semiconductor chips like the chip 1500 of FIG. 15 may be arranged on a printed circuit board in a modularized high-power amplifier architecture. For example, in some embodiments, packaged semiconductor chips similar to the chip 1500 of FIG. 15 may be arranged according to the three-stage amplifier architecture 300 of FIG. 3, described in detail above.

Figure 16:
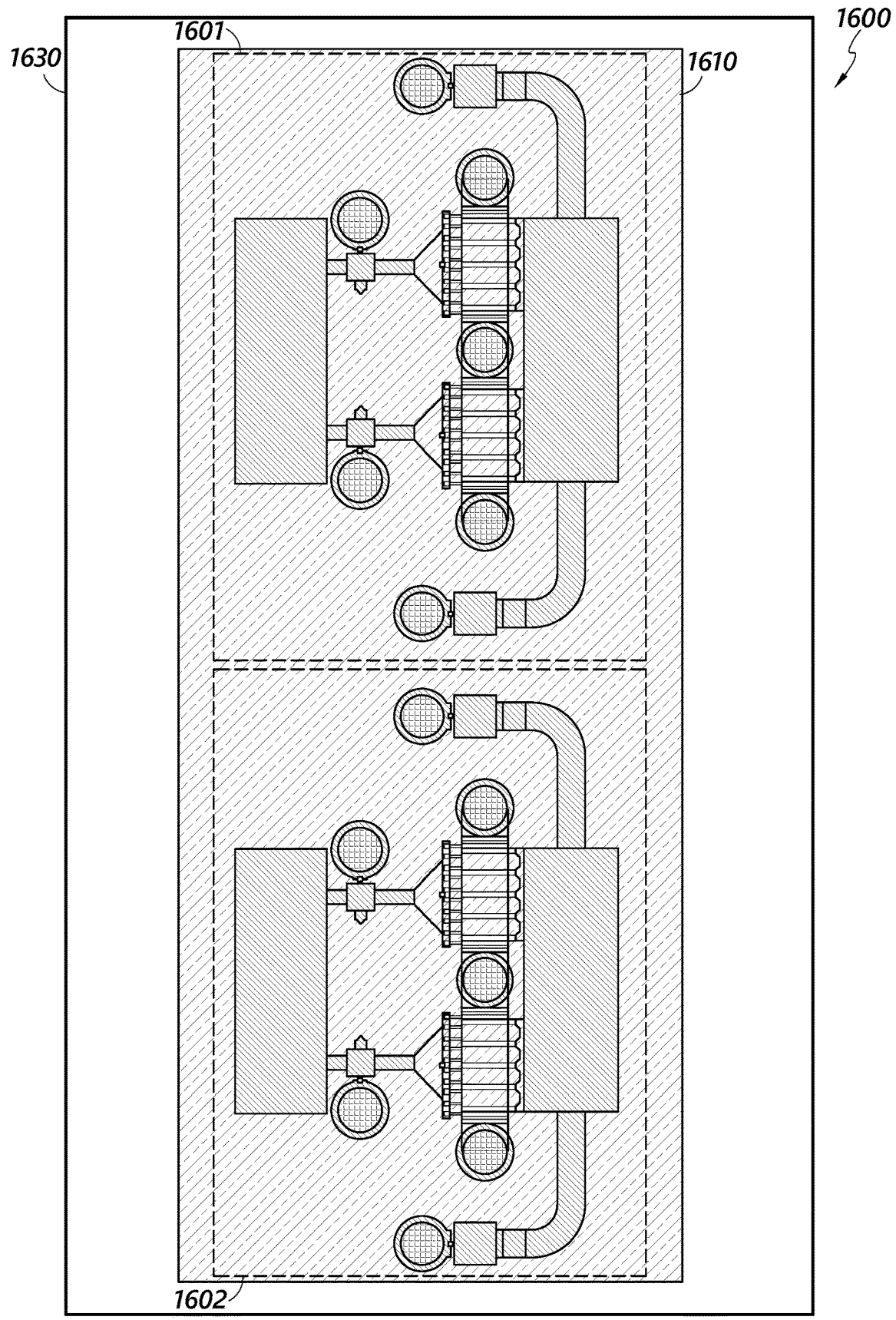
FIG. 16 illustrates a single-stage power amplifier die in accordance with one or more embodiments.

FIG. 16 illustrates another example architecture of a single-stage power amplifier die 1610 implemented in a chip package 1630. The power amplifier die 1610 may comprise GaN or other type of semiconductor substrate. In some embodiments, the amplifier die 1610 comprises two groups 1601, 1602 of transistors connected in parallel.

Figure 17:
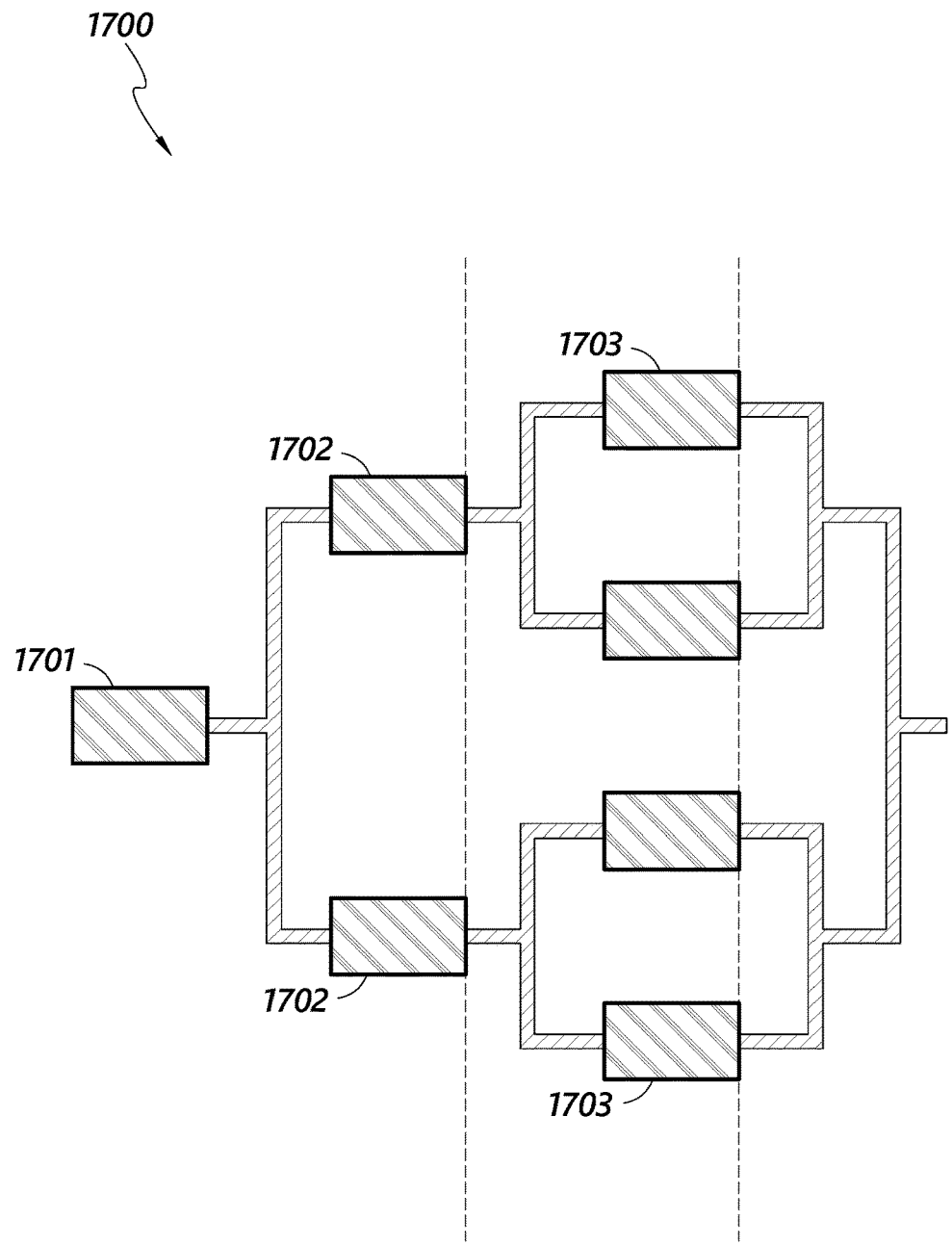
FIG. 17 illustrates a amplifier architecture in accordance with one or more embodiments.

FIG. 17 illustrates an example architecture 1700 that may be used to combine chips similar to that shown in FIG. 16 in a modularized high-power amplifier architecture. As shown, a power amplifier architecture including chips in accordance with FIG. 16 may comprise seven or fewer packaged semiconductor chips in some implementations. For the architecture 1700 of FIG. 17, all DC-blocking and/or bias circuitry may advantageously be implemented on the circuit board on which the packaged semiconductor chips are mounted.

Figure 18:
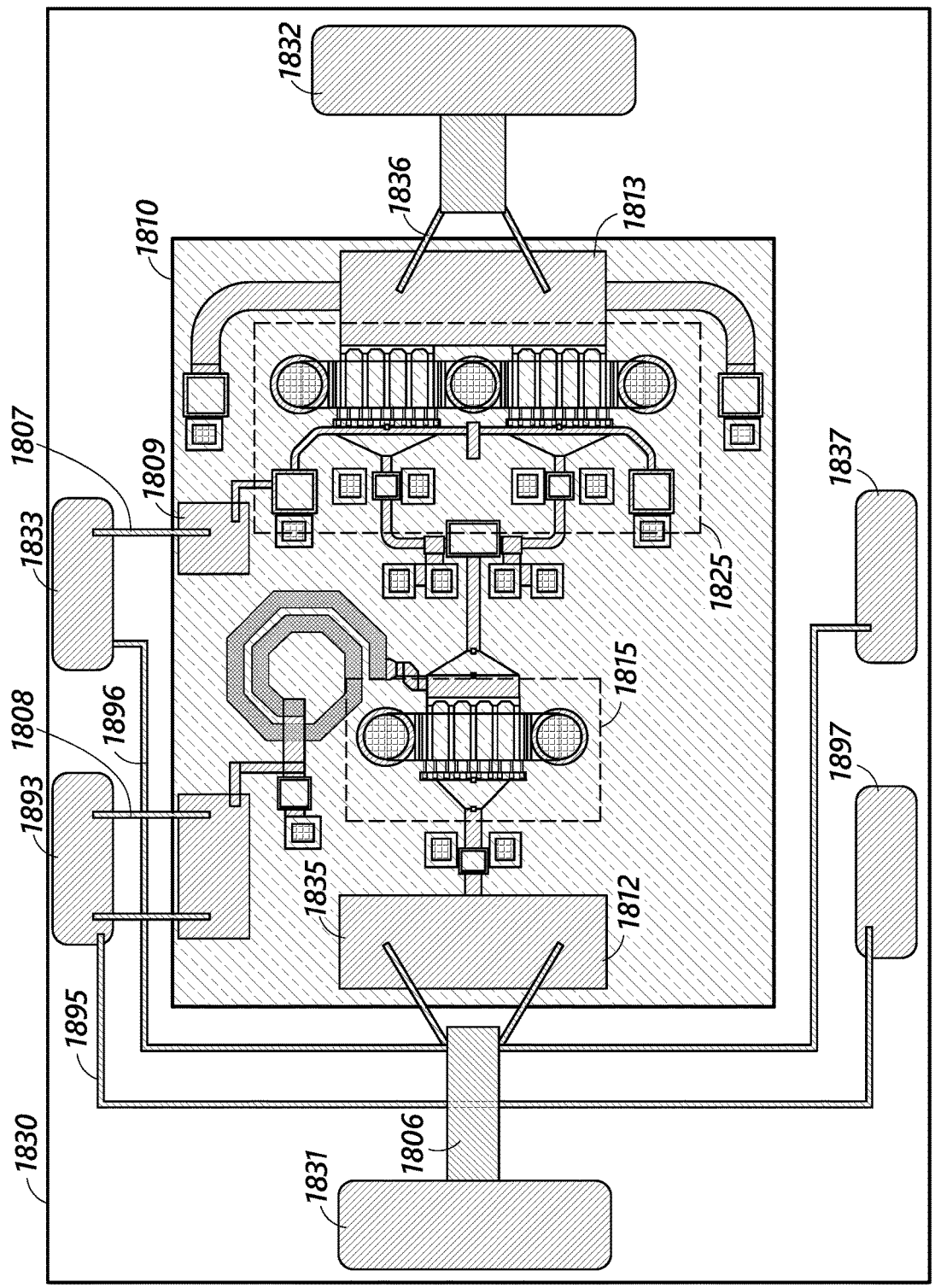
FIG. 18 illustrates a two-stage amplifier die packaged in a single no-leads package in accordance with one or more embodiments.

FIG. 18 illustrates an embodiment of a two-stage amplifier die comprising a semiconductor substrate 1810 packaged in a single no-leads package 1830. For example, the package 1830 may be a QFN package, as described in detail herein. The packaged semiconductor chip 1800 may comprise a multi-layer laminate package. In some embodiments, input biasing voltage is provided on a first pin 1833 of the lead frame of the package 1830 and is routed to a pin 1837 on an opposite side of the package 1830 through the radio-frequency input pad 1812 implemented on the semiconductor substrate 1810 and/or electrical contact 1806 electrically coupled thereto. The input bias signal may be provided to the second stage 1825 through bondwire coupling 1807 to a bias pad 1809 of the die.

The output bias voltage may be provided on another pin 1893 and provided to amplifier stage outputs through bondwire coupling 1808 to the die/substrate 1810. Furthermore, in order to allow daisy-chaining, the output voltage may be provided on a path 1895 and routed underneath the RF signal layer in a signal transmission layer that is isolated from the RF signal layer by a ground-reference metal layer. In some embodiments, a slot-via process is implemented to allow for more compact layout of the device. Inter-stage matching may be implemented on the die 1810 between amplifier stages.

Figure 19:
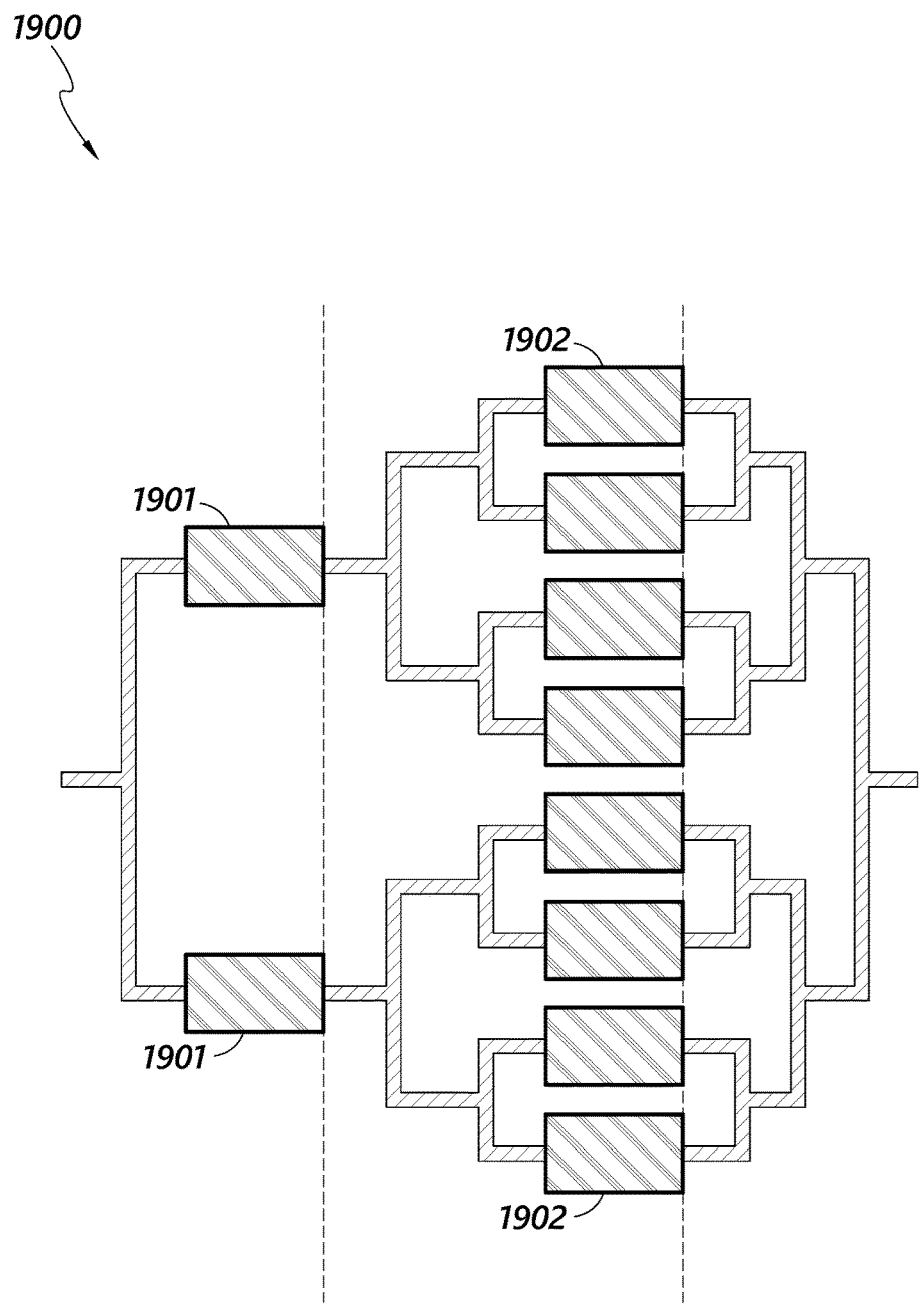
FIGS. 19-21 illustrate example amplifier architectures that may incorporate modularized packaged semiconductor chips in accordance with some embodiments.
Figure 20:
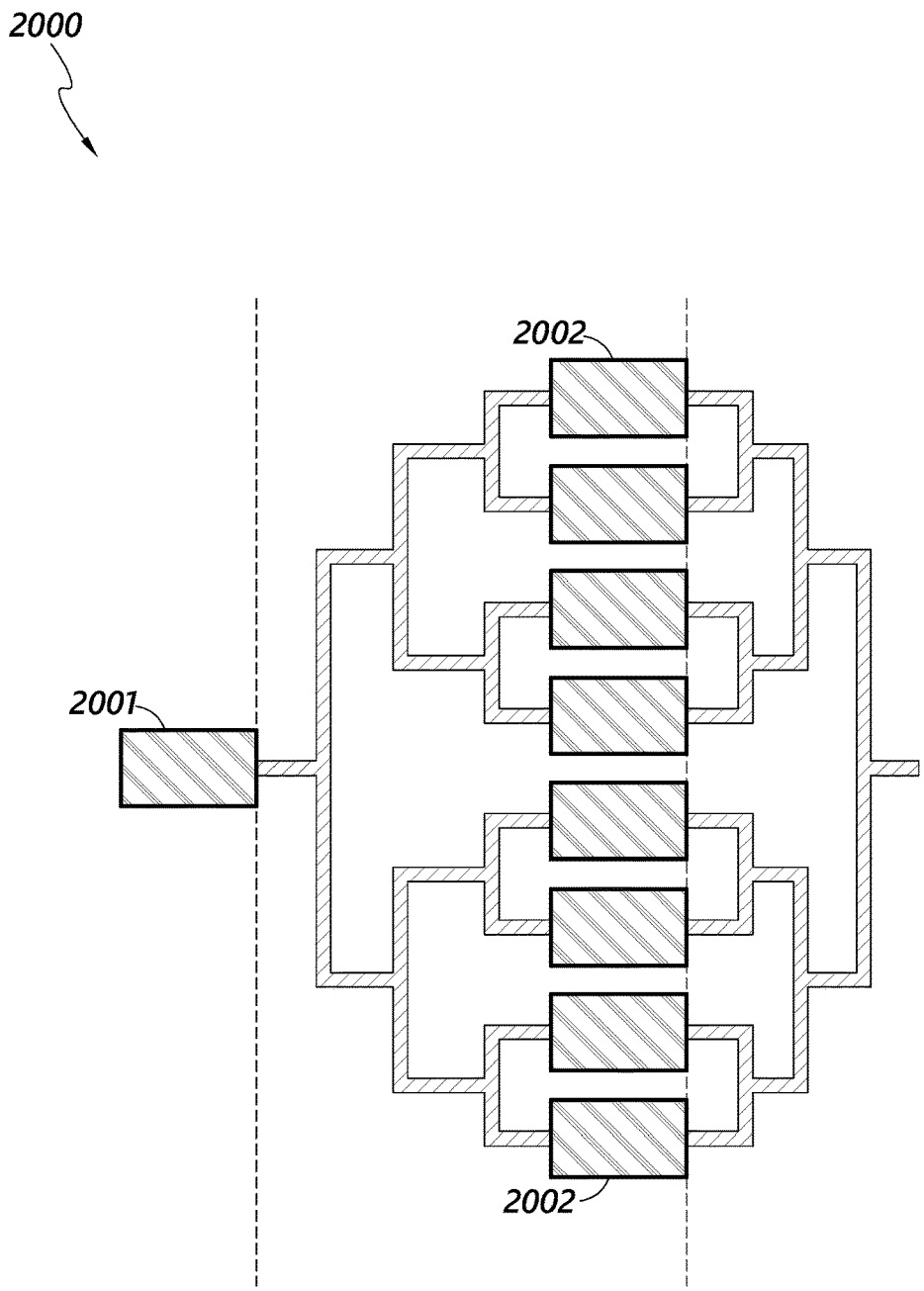
Figure 21:
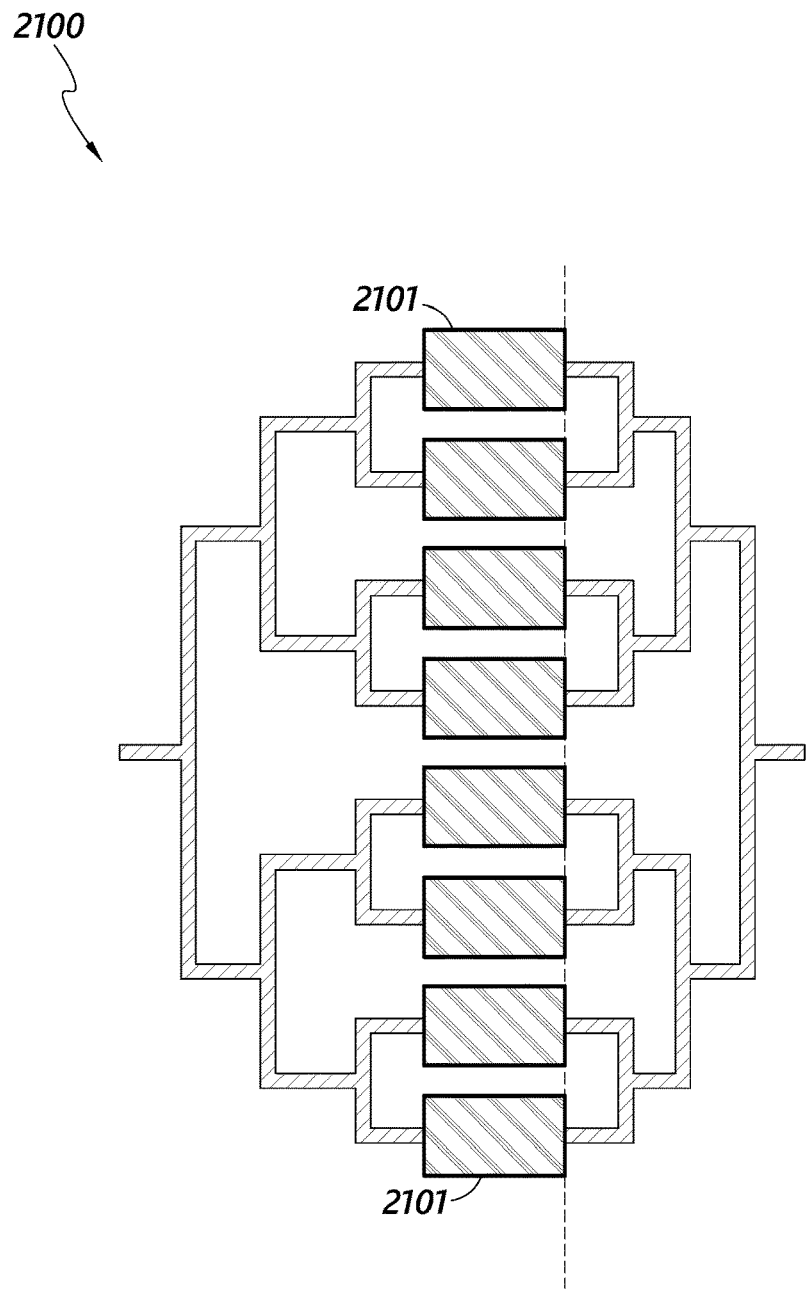

FIGS. 19-21 illustrate example amplifier architectures that may incorporate modularized packaged semiconductor chips in accordance with embodiments of the present disclosure. For example, the individual chips illustrated FIGS. 19-21 may be similar in certain respects to the packaged semiconductor chip 800 shown in FIG. 8 and described above.

FIG. 19 shows a four-stage amplifier architecture comprising two groups of parallel two-stage packaged semiconductor amplifier chips 1901, 1902. FIG. 20 shows a four-stage amplifier architecture 2000 including a first two-stage packaged semiconductor chip 2001 coupled to a group of parallel two-stage packaged semiconductor chips 2002. In some embodiments, the first chip 2001 is a one-stage amplifier chip, whereas the parallel chips 2000 to our two-stage amplifier chips. In such embodiments, the amplifier 2000 may be a 3-stage amplifier. FIG. 21 illustrates an amplifier architecture 2100 comprising a single group of parallel-connected packaged amplifier chips in accordance with one or more embodiments of the present disclosure. In the architecture 2100 of FIG. 21, both the input and output connection networks of the chips are connected together.

As described in detail herein, modularized high-power amplifier architectures utilizing separate packaged semiconductor chips electrically coupled on a printed circuit board or other substrate may allow for a relatively higher percentage of the semiconductor die area (e.g. GaN die area) to be allocated for active amplifier transistors, and less for passive matching circuitry. For example, this may be accomplished by one or more of the following processes and/or features: making the semiconductor die interface impedance have a non-standard value (e.g. impedance value other than 50, or whatever impedance is convenient), which may allow for only part or none of the necessary or desired radio-frequency matching circuitry to be implemented on the semiconductor die; using package features and/or wirebond interface elements to perform at least part of the necessary or desired radio-frequency matching; and using the circuit board or other substrate on which packaged semiconductor chips are mounted for all or part of the necessary or desired radio-frequency splitting/combining and/or the remainder of the radio-frequency matching circuitry. For certain other off-chip matching solutions, such solutions may only be suitable at relatively lower frequencies, where the parasitic elements of the wirebonds and/or packaging are relatively small With respect to high-frequency operation in accordance with embodiments of the present disclosure, some amounts of impedance matching may advantageously be implemented on the semiconductor die in order to cause the die to be relatively less sensitive to the parasitic elements of the wirebonds and/or package interface, as well as to take advantage of such parasitic elements as part of the necessary or desirable impedance matching circuitry.

Embodiments of the present disclosure allow for configuring of gate and/or drain bias injection in a manner that allows for building-block packaged semiconductor chips to be cascaded in series for higher gain and/or in parallel to provide desired power scalability. Radio-frequency input paths may be direct-current (DC) blocked, while the radio-frequency output may not be DC-block, such that the drain/output voltage can be injected on the radio-frequency splitter/combiner network without requiring additional off-chip DC-blocking circuitry. The input/gate voltage may be applied via a biased network that can be interconnected to parallel chips. In some embodiments, all of the stability circuitry is included in the packaged chip, such that no external bypassing is required. In some embodiments, first- and second-stage gate and/or drain voltages are interconnected on the die of the chip, such that no external connections are required.

Embodiments of the present disclosure may advantageously provide improved design flexibility and/or simplicity. For example, with building-block packaged amplifier chips, power amplifiers of different power levels and/or different gates may be made without requiring additional fabrication cycling for the semiconductor wafer, but rather simply by modifying or altering the connections or the features of the principal board. Since the same building-block chip is used multiple times, much more design effort/intensity may be used to optimize performance and/or minimize the size of the die due to the payoff for doing so having a larger multiplier. Furthermore, since the building-block packaged semiconductor chips of the present disclosure split the thermal profile of a power amplifier architecture and can be spread out on the printed circuit board as much as needed or desired, the package may become relatively cheaper and may not require as much metal for thermal energy dissipation. That is, the thermal profile design may trade against the printed circuit board size.

GENERAL COMMENTS

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Description using the singular or plural number may also include the plural or singular number respectively. The word "or" in reference to a list of two or more items, that word covers all of the following interpretations of the word: any of the items in the list, all of the items in the list, and any combination of the items in the list.

Reference throughout this disclosure to "some embodiments," "certain embodiments" or "an embodiment" means that a particular feature, structure or characteristic described in connection with the embodiment can be included in at least some embodiments. Thus, appearances of the phrases "in some embodiments," "in certain embodiment," or "in an embodiment" in various places throughout this specification are not necessarily all referring to the same embodiment, and may refer to one or more of the same or different embodiments. Furthermore, embodiments disclosed herein may or may not be embodiments of the invention. For example, embodiments disclosed herein may, in part or in whole, include non-inventive features and/or components. In addition, the particular features, structures or characteristics can be combined in any suitable manner, as would be apparent to one of ordinary skill in the art from this disclosure, in one or more embodiments.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While some embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A packaged semiconductor chip comprising:
    a semiconductor substrate;
    a radio-frequency (RF) input contact pad implemented on the semiconductor substrate;
    an RF output contact pad implemented on the semiconductor substrate;
    first and second direct-current (DC) contact pads implemented on the semiconductor substrate;
    a first amplifier stage implemented on the semiconductor substrate, the first amplifier stage comprising one or more first transistors and having an input coupled with the RF input contact pad;
    a second amplifier stage implemented on the semiconductor substrate, the second amplifier stage comprising one or more second transistors and having an input coupled with an output of the first amplifier stage and an output coupled with the RF output contact pad;
    an input bias coupling path implemented on the semiconductor substrate and electrically routing the first DC contact pad to the second DC contact pad and the input of the first amplifier stage;
    an output bias coupling path implemented on the semiconductor substrate and electrically routing an output bias signal to the output of the second amplifier stage and to the output of the first amplifier stage; and
    a lead frame comprising:
        one or more RF input pins electrically coupled to the RF input contact pad;
        one or more RF output pins electrically coupled to the RF output contact pad; and
        first and second input bias pins electrically coupled to the first and second DC contact pads, respectively.

2. The packaged semiconductor chip of claim 1, wherein the second amplifier stage is configured to receive an output bias signal from at least one of the one or more RF output pins of the lead frame.

3. The packaged semiconductor chip of claim 1, wherein the first and second DC contact pads are disposed on the semiconductor substrate on opposite sides of the RF input contact pad.

4. The packaged semiconductor chip of claim 1, wherein:
    the one or more first transistors comprises a plurality of field-effect transistors; and
    the RF input contact pad is electrically routed to gates of the plurality of field-effect transistors.

5. The packaged semiconductor chip of claim 1, wherein the input bias coupling path allows for parallel daisy-chaining of the packaged semiconductor chip with another packaged semiconductor chip.

6. The packaged semiconductor chip of claim 1, further comprising DC-blocking circuitry implemented on the semiconductor substrate and configured to block DC current between the RF input contact pad and the input of the first amplifier stage.

7. The packaged semiconductor chip of claim 1, wherein the second amplifier stage is DC blocked from the first amplifier stage.

8. The packaged semiconductor chip of claim 1, wherein:
    the one or more second transistors of the second amplifier stage comprises a plurality of second transistors connected in parallel; and
    inputs of the plurality of second transistors are electrically connected.

9. The packaged semiconductor chip of claim 1, wherein the lead frame is a component of a flat no-leads package.

10. The packaged semiconductor chip of claim 1, further comprising an output matching circuit disposed within the package.

11. The packaged semiconductor chip of claim 10, wherein the output matching circuit is implemented on the semiconductor substrate.

12. The packaged semiconductor chip of claim 1, wherein the input bias coupling path electrically routes the first DC contact pad to the input of the second amplifier stage.

13. A power amplifier comprising:
a printed circuit board; and
a plurality of packaged semiconductor chips mounted on the printed circuit board in a power amplifier configuration, each of the plurality of packaged semiconductor chips comprising:
a semiconductor substrate;
a radio-frequency (RF) input contact pad implemented on the semiconductor substrate;
an RF output contact pad implemented on the semiconductor substrate;
first and second direct-current (DC) contact pads implemented on the semiconductor substrate;
a first amplifier stage implemented on the semiconductor substrate, the first amplifier stage comprising one or more first transistors and having an input coupled with the RF input contact pad;
a second amplifier stage implemented on the semiconductor substrate, the second amplifier stage comprising one or more second transistors and having an input coupled with an output of the first amplifier stage and an output coupled with the RF output contact pad;
an input bias coupling path implemented on the semiconductor substrate and electrically routing the first DC contact pad to the second DC contact pad and the input of the first amplifier stage;
an output bias coupling path implemented on the semiconductor substrate and electrically routing an output bias signal to the output of the second amplifier stage and to the output of the first amplifier stage;
a lead frame comprising one or more RF input pins electrically coupled to the RF input contact pad, one or more RF output pins electrically coupled to the RF output contact pad, and first and second input bias pins electrically coupled to the first and second DC contact pads, respectively; and
a surface-mount packaging that at least partially houses the semiconductor substrate and the lead frame.

14. The power amplifier of claim 13, wherein the plurality of packaged semiconductor chips are identical.

15. The power amplifier of claim 13, wherein the plurality of packaged semiconductor chips comprises:
a first set of parallel packaged semiconductor chips; and
a second set of parallel packaged semiconductor chips;
wherein each of the first set of parallel packaged semiconductor chips is connected in series with at least one of the second set of parallel packaged semiconductor chips.

16. The power amplifier of claim 13, further comprising matching circuitry implemented on the printed circuit board, the matching circuitry configured to combine with parasitic elements of the plurality of packaged semiconductor chips to provide impedance matching for the plurality of packaged semiconductor chips for high-frequency operation.

17. The power amplifier of claim 16, wherein the high-frequency operation corresponds to the Ka frequency band.

18. The power amplifier of claim 13, wherein the input bias coupling path electrically routes the first DC contact pad to the input of the second amplifier stage.

19. A method of manufacturing a power amplifier, the method comprising:
providing a plurality of packaged semiconductor chips each including respective first and second amplifier stages, the respective second amplifier stage having an input coupled with an output of the respective first amplifier stage, the packaged semiconductor chips each also including an internal bias coupling path electrically routing a first direct-current (DC) contact pad to a second DC contact pad and an input of the respective first amplifier stage;
providing a first circuit board;
forming first electrical connections in the first circuit board for connecting to a first subset of the plurality of packaged semiconductor chips; and
surface mounting the first subset of the plurality of packaged semiconductor chips on the first circuit board in a first multi-stage power amplifier configuration;
wherein the first electrical connections comprise parallel daisy-chain connections between respective internal bias coupling paths of at least two of the first subset of the plurality of packaged semiconductor chips.

20. The method of claim 19, further comprising, after said surface mounting the first subset of the plurality of packaged semiconductor chips:
providing a second circuit board;
forming second electrical connections in the second circuit board for connecting to a second subset of the plurality of packaged semiconductor chips; and
surface mounting the second subset of the plurality of packaged semiconductor chips on the second circuit board in a second multi-stage power amplifier configuration, the second multi-stage power amplifier configuration having a greater number of amplifier stages than the first multi-stage power amplifier configuration;
wherein the second electrical connections comprise parallel daisy-chain connections between respective internal bias coupling paths of at least two of the second subset of the plurality of packaged semiconductor chips.

21. The method of claim 19, further comprising determining biasing values for the first subset of the plurality of packaged semiconductor chips based on parasitic elements of the first subset of the plurality of packaged semiconductor chips at a high operational frequency.

22. The method of claim 19, further comprising determining a number of packaged semiconductor chips of the plurality of packaged semiconductor chips to connect in parallel after said providing the plurality of packaged semiconductor chips.

23. The method of claim 19, further comprising determining a number of packaged semiconductor chips of the plurality of packaged semiconductor chips to connect in series after said providing the plurality of packaged semiconductor chips.

* * * * *